United States Patent
Lee et al.

(10) Patent No.: US 10,726,931 B2
(45) Date of Patent: Jul. 28, 2020

(54) OPERATION METHOD OF MEMORY CONTROLLER AND OPERATION METHOD OF STORAGE DEVICE

(71) Applicant: Samsung Electronics Co., Ltd., Suwon-si, Gyeonggi-do (KR)

(72) Inventors: Raeyoung Lee, Suwon-si (KR); Hyunjung Kim, Suwon-si (KR); Sung-Bok Lee, Yongin-si (KR); Soyeong Gwak, Incheon (KR); Sang-wan Nam, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

(21) Appl. No.: 16/023,706

(22) Filed: Jun. 29, 2018

(65) Prior Publication Data
US 2019/0129655 A1   May 2, 2019

(30) Foreign Application Priority Data
Oct. 31, 2017   (KR) ..................... 10-2017-0143158

(51) Int. Cl.
| | | |
|---|---|---|
| *G11C 16/34* | (2006.01) | |
| *G06F 3/06* | (2006.01) | |
| *G11C 16/04* | (2006.01) | |
| *G11C 16/14* | (2006.01) | |
| *G11C 16/10* | (2006.01) | |
| *G06F 11/10* | (2006.01) | |
| *G11C 11/56* | (2006.01) | |
| *G11C 29/52* | (2006.01) | |
| *H01L 27/11568* | (2017.01) | |
| *G11C 29/04* | (2006.01) | |

(52) U.S. Cl.
CPC .......... *G11C 16/349* (2013.01); *G06F 3/0619* (2013.01); *G06F 3/0659* (2013.01); *G06F 3/0679* (2013.01); *G06F 11/1004* (2013.01); *G06F 11/1048* (2013.01); *G06F 11/1068* (2013.01); *G11C 16/0466* (2013.01); *G11C 16/10* (2013.01); *G11C 16/14* (2013.01); *G11C 11/5671* (2013.01); *G11C 29/52* (2013.01); *G11C 2029/0411* (2013.01); *H01L 27/11568* (2013.01)

(58) Field of Classification Search
CPC ..... G11C 16/10; G11C 16/0466; G11C 15/26; G11C 16/26; G11C 16/349; G11C 16/3409; G11C 16/3413; G11C 16/107; G11C 29/52; G06F 3/0619; G06F 3/0659; G06F 3/067; G06F 12/0246
See application file for complete search history.

(56) References Cited

U.S. PATENT DOCUMENTS 8,274,840 B2   9/2012   Kim et al.
8,526,245 B2   9/2013   Yoon et al.
(Continued)

*Primary Examiner* — Shelly A Chase
(74) *Attorney, Agent, or Firm* — Harness, Dickey & Pierce, P.L.C.

(57) ABSTRACT

A method of operating a memory controller, the memory controller configured to control a nonvolatile memory device, the nonvolatile memory device including a plurality of memory blocks. The method including detecting an invalid block among the plurality of memory blocks; determining an invalid pattern based on a state of the invalid block; and performing an operation on the invalid block such that the invalid block has the invalid pattern.

18 Claims, 25 Drawing Sheets

(56) References Cited

U.S. PATENT DOCUMENTS

| | | | |
|---|---|---|---|
| 8,595,593 B2 | 11/2013 | Joo | |
| 9,158,670 B1* | 10/2015 | Kang | ............... G06F 12/0246 |
| 9,201,789 B1 | 12/2015 | Kang et al. | |
| 9,563,504 B2 | 2/2017 | Liang et al. | |
| 9,627,084 B2 | 4/2017 | Kwak et al. | |
| 9,646,704 B2 | 5/2017 | Moon et al. | |
| 2011/0255338 A1* | 10/2011 | Kim | ................. G11C 11/5628 |
| | | | 365/185.09 |
| 2017/0060447 A1 | 3/2017 | Moon et al. | |
| 2017/0076807 A1* | 3/2017 | Asami | ................. G11C 16/26 |
| 2017/0123870 A1 | 5/2017 | Tai et al. | |

* cited by examiner

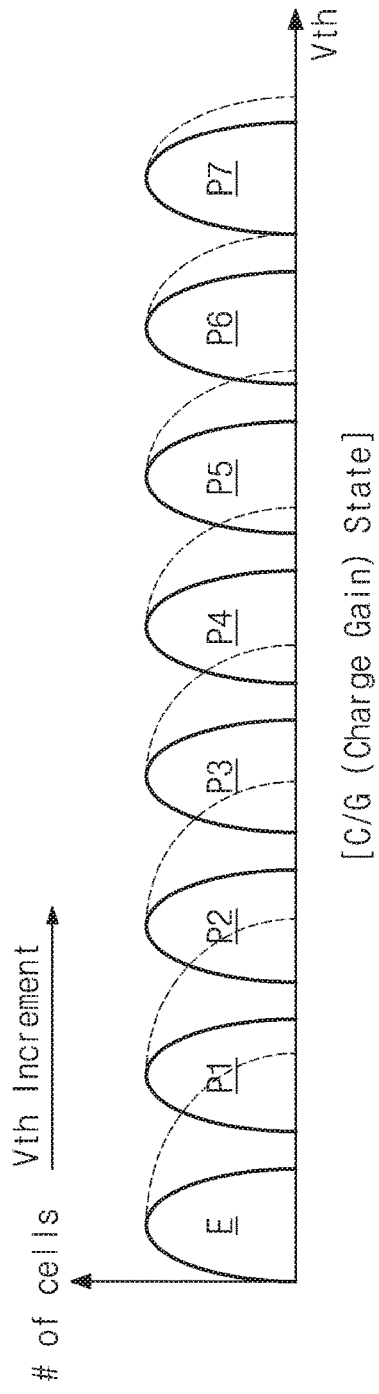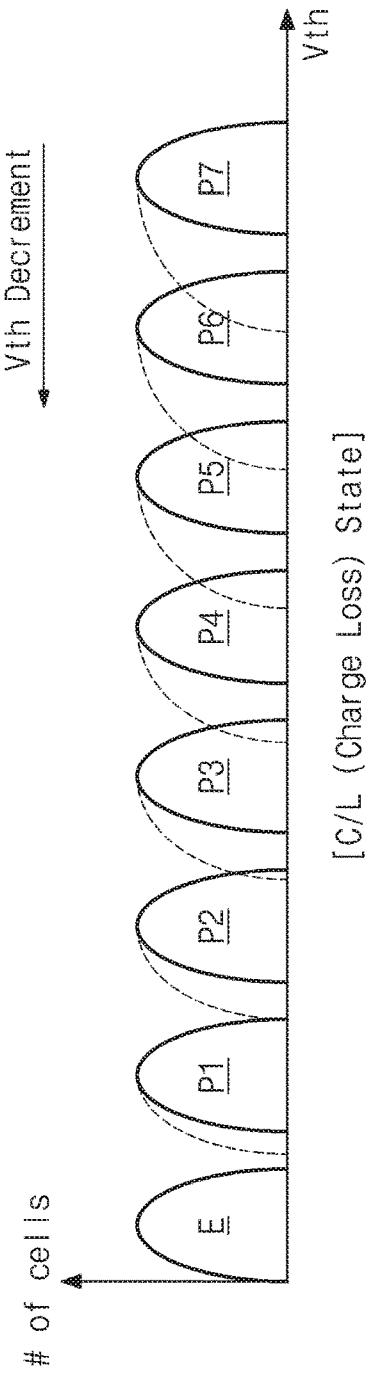

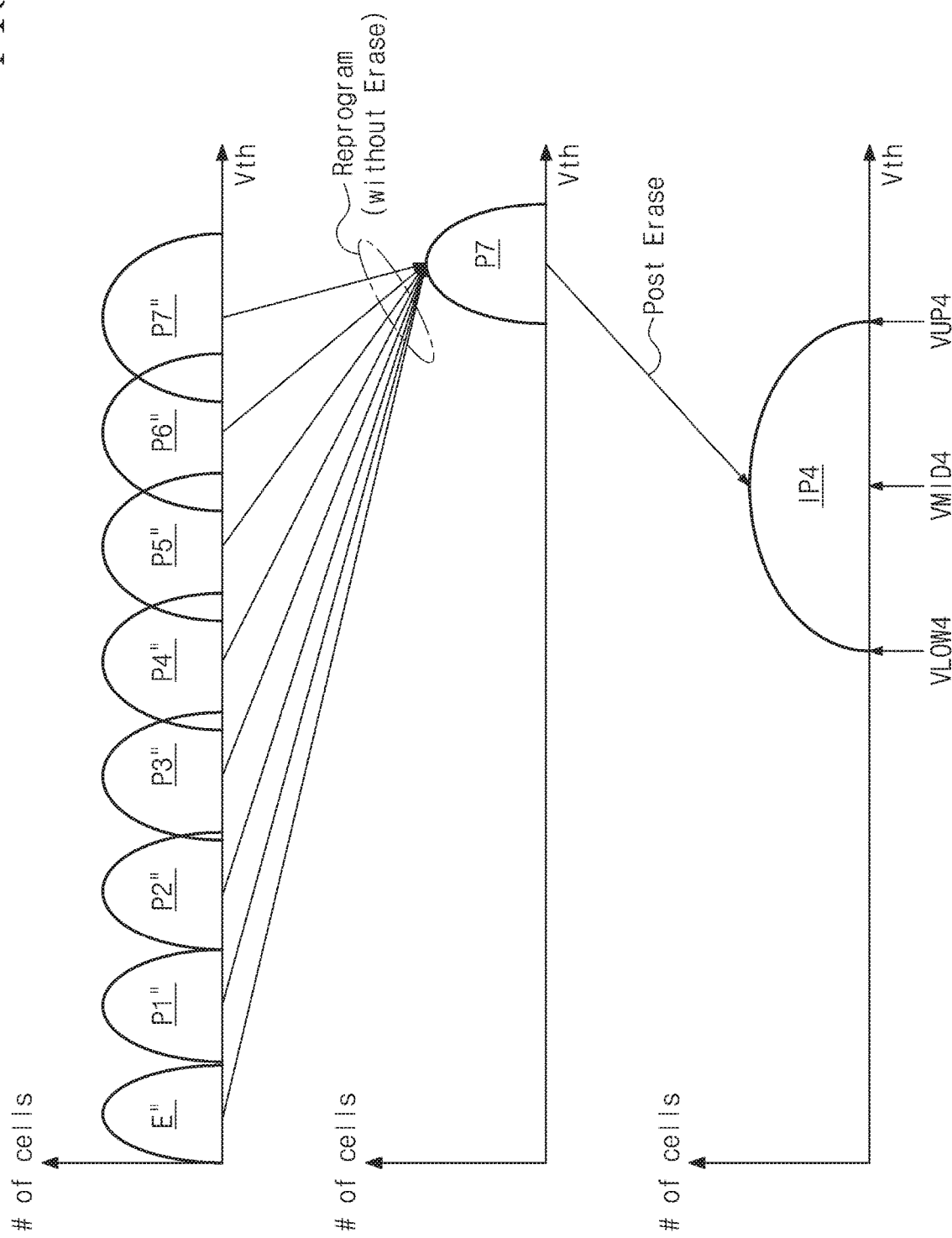

FIG. 11

LUT

| P/E Cycle | Invalid Pattern Parameter | | | |
|---|---|---|---|---|
| | Invalid Pattern | Upper Limit | Lower Limit | Mid-Level |
| P/E1 | IP1 | VUP1 | VLOW1 | VMID1 |
| P/E2 | IP2 | VUP2 | VLOW2 | VMID2 |
| ⋮ | ⋮ | ⋮ | ⋮ | ⋮ |
| P/En-1 | IPn-1 | VUPn-1 | VLOWn-1 | VMIDn-1 |
| P/En | IPn | VUPn | VLOWn | VMIDn |

OPERATION METHOD OF MEMORY CONTROLLER AND OPERATION METHOD OF STORAGE DEVICE

CROSS-REFERENCE TO RELATED APPLICATIONS

This application claims priority under 35 U.S.C. § 119 to Korean Patent Application No. 10-2017-0143158 filed Oct. 31, 2017, in the Korean Intellectual Property Office, the disclosures of which are incorporated by reference herein in their entireties.

BACKGROUND

Example embodiments of the inventive concepts described herein relate to a semiconductor memory and/or a method of operating the same. For example, at least some example embodiments relate to an operation method of a memory controller and/or an operation method of a storage device.

Semiconductor memory devices are classified into volatile memory devices, which lose data stored therein at power-off, such as a static random access memory (SRAM), a dynamic RAM (DRAM), a synchronous DRAM (SDRAM), and the like, and nonvolatile memory devices, which retain data stored therein even at power-off, such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

The flash memory device stores data by setting the threshold voltages of memory cells. However, as a time elapses, the threshold voltages of the memory cells may vary due to various factors. In the case where threshold voltages of the memory cells vary, data stored in the flash memory device may not be identified normally. That is, the change in the threshold voltages of the memory cells may cause a decrease in reliability of data stored in the flash memory device.

SUMMARY

Example embodiments of the inventive concepts provide an operation method of a memory controller and an operation method of a storage device, capable of improving performance.

At least some example embodiments are directed to a method of operating a memory controller, the memory controller configured to control a nonvolatile memory device, the nonvolatile memory device including a plurality of memory blocks.

In some example embodiments, the method includes detecting an invalid block among the plurality of memory blocks; determining an invalid pattern based on a state of the invalid block; and performing an invalid pattern operation on the invalid block such that the invalid block has the invalid pattern.

At least some example embodiments are directed to a method of operating a storage device, the storage device including a plurality of memory blocks.

In some example embodiments, the method includes detecting an invalid block among the plurality of memory blocks; determining an invalid pattern based on a state of the invalid block; and performing an invalid pattern operation on the invalid block such that the invalid block has the invalid pattern.

At least some example embodiments are directed to a method of operating a memory controller, the memory controller configured to control a nonvolatile memory device that includes a plurality of memory blocks.

In some example embodiments, the method includes detecting an invalid block among the plurality of memory blocks; determining an invalid pattern based on a state of the invalid block; and sending an invalid pattern command to the nonvolatile memory device, the invalid pattern command including an address for the invalid block.

BRIEF DESCRIPTION OF THE FIGURES

The above and other objects and features of example embodiments of the inventive concepts will become apparent by describing in detail some example embodiments thereof with reference to the accompanying drawings.

FIGS. 6A and 6B are distribution diagrams illustrating threshold voltages of memory cells, which vary with states (i.e., a charge gain state and a charge loss state) of a memory block.

FIGS. 9A and 9B are distribution diagrams for describing various invalid patterns.

FIG. 11 is a look-up table illustrating an invalid pattern corresponding to the number of P/E cycles of an invalid block.

DETAILED DESCRIPTION

Below, example embodiments of the inventive concepts may be described in detail and clearly to such an extent that an ordinary one in the art easily implements the inventive concepts.

Figure 1:
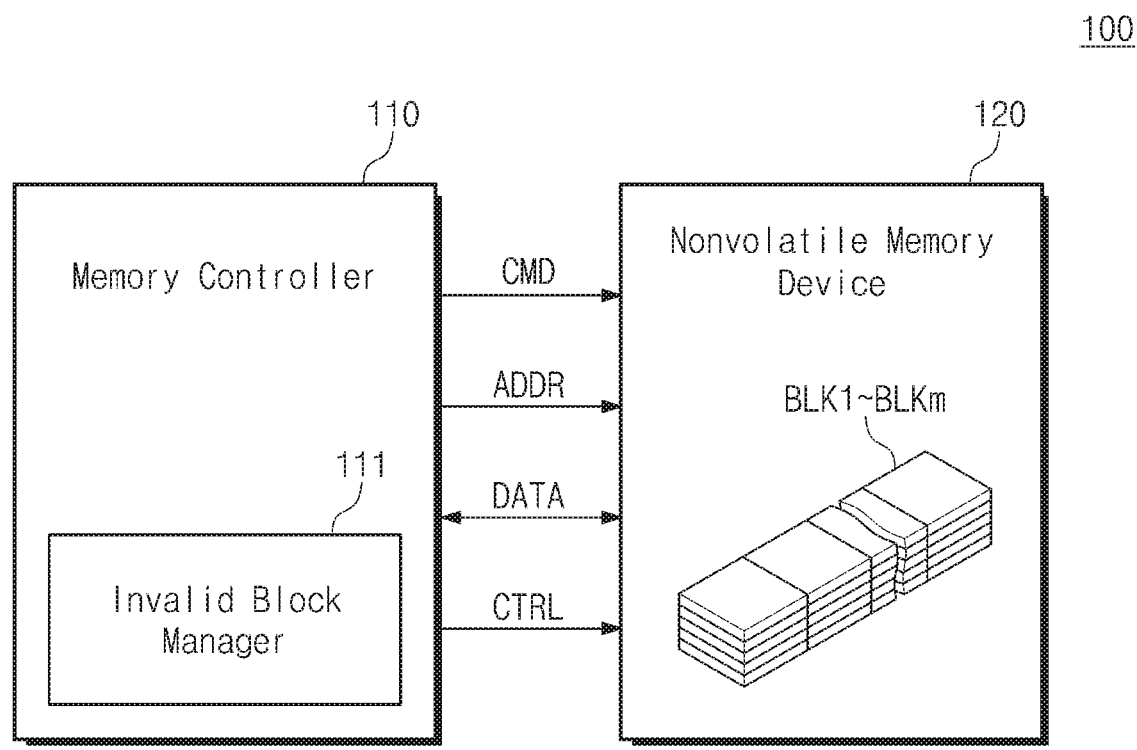
FIG. 1 is a block diagram illustrating a storage device according to an example embodiment of the inventive concepts.

FIG. 1 is a block diagram illustrating a storage device according to an example embodiment of the inventive concepts.

Referring to FIG. 1, a storage device 100 includes a memory controller 110 and a nonvolatile memory device 120. The storage device 100 may include a high-capacity storage medium such as a solid state drive (SSD), a memory card, or a memory stick.

The memory controller 110 may transmit a command CMD, an address ADDR, and a control signal CTRL to the nonvolatile memory device 120 to store data "DATA" in the nonvolatile memory device 120 or read data "DATA" from the nonvolatile memory device 120. In response to signals received from the memory controller 110, the nonvolatile memory device 120 may store the data "DATA" or may provide stored data "DATA" to the memory controller 110.

In an example embodiment, the memory controller 110 may include an invalid block manager 111. The invalid block manager 111 may be configured to manage an invalid memory block (hereinafter referred to as an "invalid block") among a plurality of memory blocks BLK1 to BLKm included in the nonvolatile memory device 120. The invalid block may refer to a memory block that stores invalid data. Alternatively, the invalid block may refer to a memory block that does not store valid data. As discussed below, to improve the reliability of the storage device 100, the invalid block manager 111 may allow an invalid block to have an invalid pattern based on a state of the invalid block. In an example embodiment, the invalid pattern may refer a threshold voltage distribution of memory cells in the invalid block.

In an example embodiment, the invalid block may be generated by a maintenance operation of the memory controller 110. For example, the memory controller 110 may move valid data stored in source blocks to a target block through a garbage collection operation. Alternatively, the memory controller 110 may move valid data of a source block, in which data including an error of a specific level or higher are stored, to a target block through a read reclaim operation. After all valid data of the source block are moved to the target block through the garbage collection operation or the read reclaim operation, the data stored in the source block may be set to invalid data, and the source block storing the invalid data may be considered as an invalid block. That is, as described above, the invalid block may refer to a memory block that stores only invalid data or a memory block that does not store valid data.

The invalid block may store or maintain invalid data until reused by the memory controller 110. In the case where the invalid block is reused by the memory controller 110, the memory controller 110 may erase the invalid block and may program new data in the erased invalid block. Below, a time from a time point when a specific memory block is set to an invalid block to a time point when the specific memory block is reused by the memory controller 110 is referred to as a "leaving time".

A reliability characteristic of an invalid block may vary with data programmed in the invalid block and the leaving time. For example, if erasing of the invalid block and writing of valid data in the erased invalid block are made under control of a memory controller after a specific memory block (i.e., an invalid block) is left in an erase state, an error may be included in the valid data written in the specific memory block as a time elapses from a time point when the valid data are written. This error may be caused by a decrease in the threshold voltages of memory cells in the specific memory block as a time elapses. Below, a decrease in threshold voltages of memory cells is referred to as "charge loss", and a state of a memory block in which the charge loss occurs is referred to as a "charge loss state".

Alternatively, if erasing of the invalid block and writing of valid data in the erased invalid block are made under control of a memory controller after a specific memory block (i.e., an invalid block) is left in the uppermost program state, an error may be included in the valid data written in the specific memory block as a time elapses from a time point when the valid data are written. This error may be caused by an increase in the threshold voltages of memory cells in the specific memory block as a time elapses. Below, an increase in threshold voltages of memory cells is referred to as "charge gain", and a state of a memory block in which the charge gain occurs is referred to as a "charge gain state". The charge loss and the charge gain will be more fully described with reference to FIGS. 5, 6A, and 6B.

As described above, the reliability of data to be programmed later may decrease depending on a state of the invalid block (i.e., the charge loss state or the charge gain state).

Therefore, in one or more example embodiments, the invalid block manager 111 according to example embodiments of the inventive concepts may determine an invalid pattern depending on a state of the invalid block and may perform an invalid pattern operation on the invalid block such that the invalid block has the determined invalid pattern. In an example embodiment, the invalid pattern operation may include a program operation, a reprogram operation, a soft-program operation, an erase operation, or a soft-erase operation.

For example, in the case where an invalid block is in the charge gain state, the invalid block manager 111 may program or erase the invalid block such that the invalid block has a first invalid pattern. In the case where an invalid block is in the charge loss state, the invalid block manager 111 may program or erase the invalid block such that the invalid block has a second invalid pattern. In this case, each of the first and second invalid patterns may refer to a pattern of a threshold voltage distribution of memory cells of an invalid block, and a low limit value, an upper limit value, or a middle value of the first invalid pattern may be lower than a low limit value, an upper limit value, or a middle value of the second invalid pattern.

That is, a later charge gain (or charge gain phenomenon) may decrease or may be offset by making an invalid block of the charge gain state left with the first invalid pattern, and a later charge loss (or charge loss phenomenon) may decrease or may be offset by making an invalid block of the charge loss state left with the second invalid pattern.

As described above, as an invalid block is left in a state where the invalid block has a corresponding invalid pattern, threshold voltages of memory cells to be programmed later may remain relatively more consistent. Accordingly, the reliability of the storage device 100 is improved.

Figure 2:
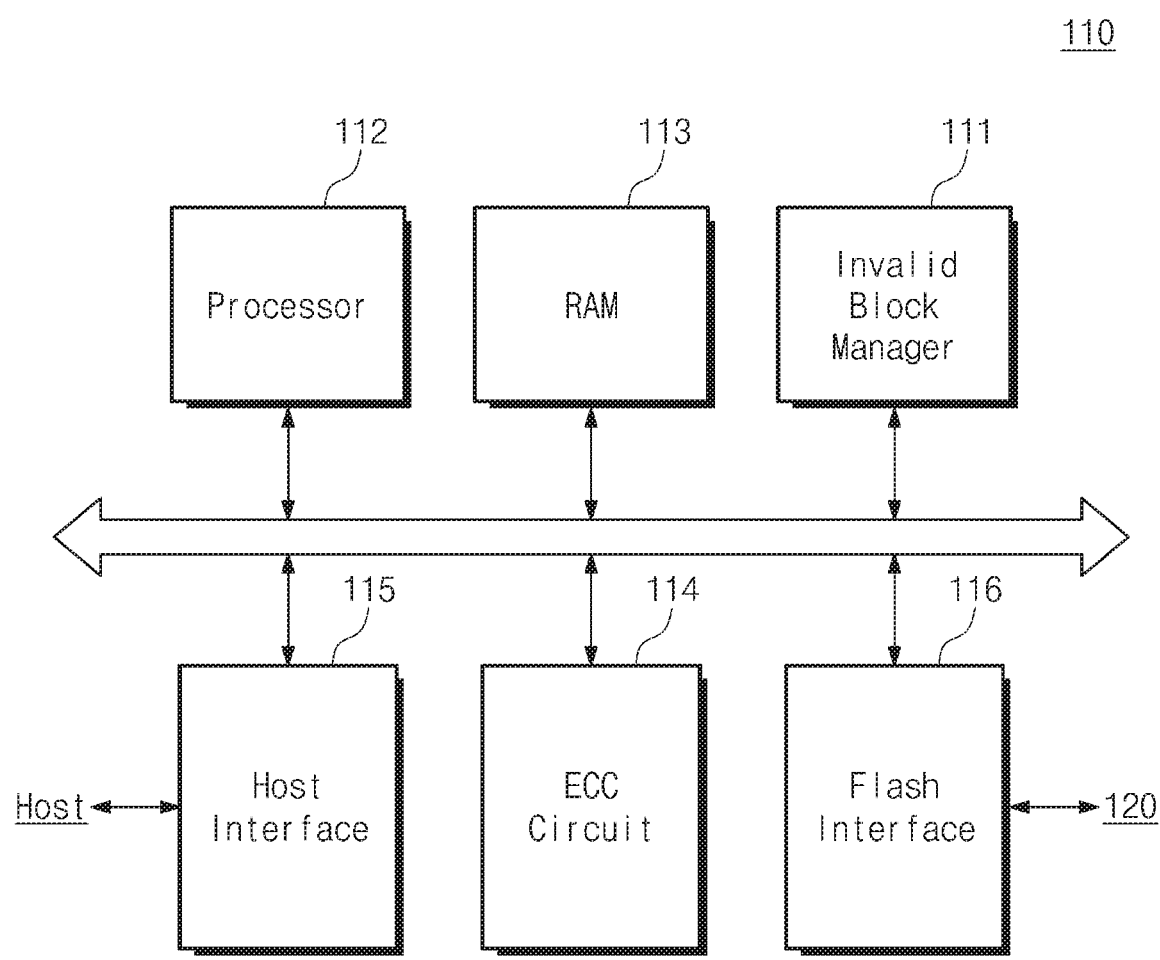
FIG. 2 is a block diagram illustrating a memory controller of FIG. 1 in detail.

FIG. 2 is a block diagram illustrating the memory controller 110 of FIG. 1 in detail.

Referring to FIGS. 1 and 2, the memory controller 110 may include the invalid block manager 111, a processor 112, a RAM 113, an error correction code (ECC) circuit 114, a host interface 115, and a flash interface 116.

The invalid block manager 111 may be configured to manage an invalid block among a plurality of memory blocks BLK1 to BLKm of the nonvolatile memory device 120. The invalid block manager 111 is described with reference to FIG. 1, and thus a detailed description thereof will not be repeated here. Although not illustrated in FIG. 2, the invalid block manager 111 may be included in a flash translation layer (FTL) of the memory controller 110.

The processor 112 may perform overall operations of the memory controller 110. The RAM 113 may be used as a working memory, a buffer memory, or a cache memory of the memory controller 110. The RAM 113 may store various information or various software components that are needed for the memory controller 110 to operate.

In an example embodiment, the invalid block manager 111 may be implemented in the form of a software component, a hardware component, or a combination thereof. In the case where the invalid block manager 111 is implemented with a software component, the invalid block manager 111 may be stored in the RAM 113, and the invalid block manager 111 stored in the RAM 113 may be driven or executed by the processor 112.

For example, the RAM 113 may store instructions, that, when executed by the processor 112, configure the processor 112 as a special purpose processor to perform the functions of the invalid block generator 111 such that the processor 112 is configured to program an invalid block with an invalid pattern based on a state of the invalid block such that memory cells in the invalid block have a desired threshold voltage distribution. Therefore, the processor 112 may improve functioning of the storage device 100 itself by improving the reliability of data stored in the storage device 100.

The ECC circuit 114 may generate an error correction code for data to be stored in the nonvolatile memory device 120. The ECC circuit 114 may receive data and an error correction code from the nonvolatile memory device 120 and may detect and correct an error of the data based on the error correction code.

The memory controller 110 may communicate with a host (or an external device) through the host interface 115. In an example embodiment, the host interface 115 may include at least one of various interfaces such as a double data rate (DDR) interface, an universal serial bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA interface, a parallel-ATA interface, a small computer small interface (SCSI), an enhanced small disk interface (ESDI), an integrated drive electronics (IDE) interface, Fireware, an universal flash storage (UFS) interface, and a nonvolatile memory express (NVMe) interface. The memory controller 110 may communicate with the nonvolatile memory device 120 through the flash interface 116.

Figure 3:
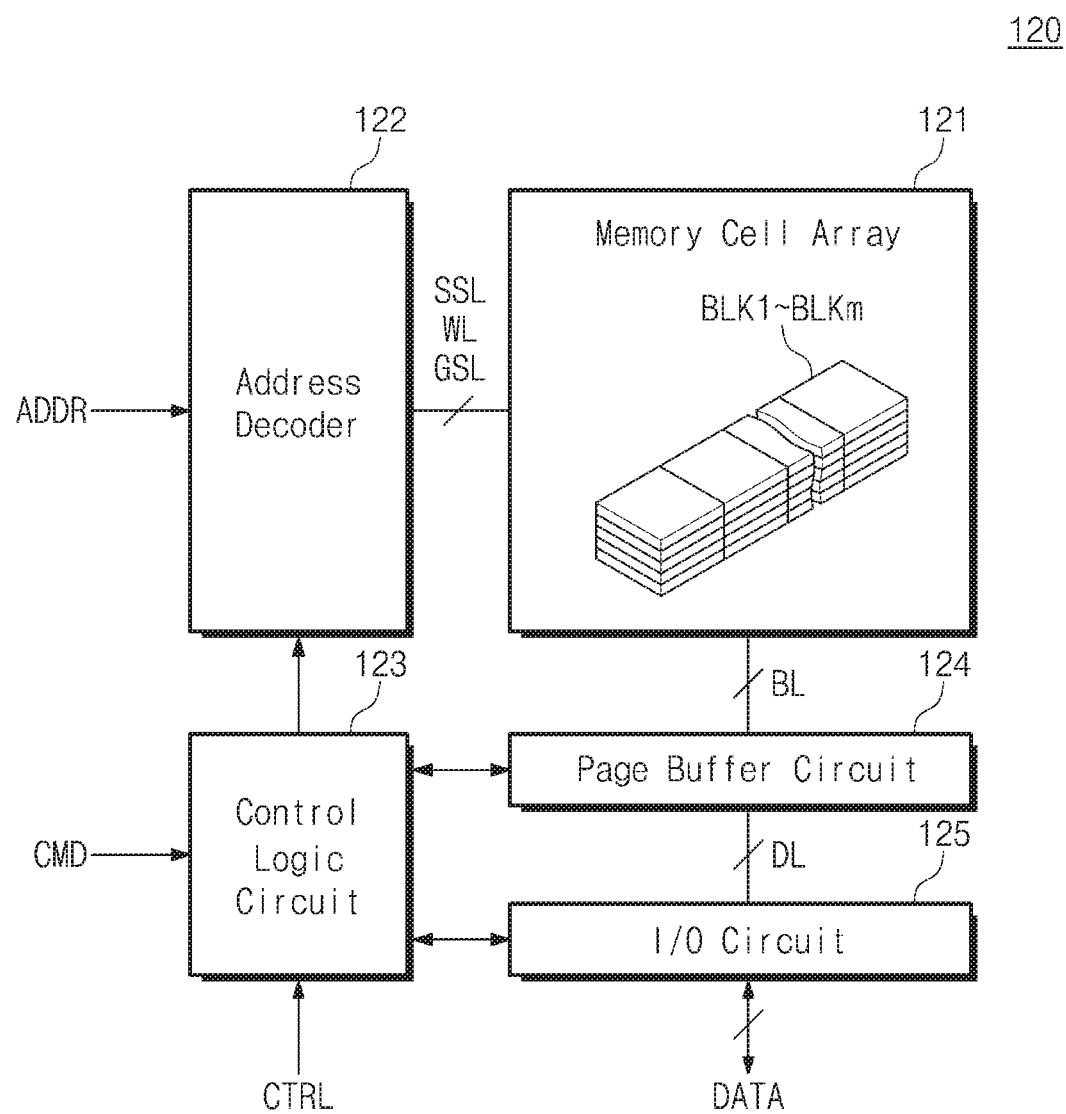
FIG. 3 is a block diagram illustrating a nonvolatile memory device of FIG. 1.

FIG. 3 is a block diagram illustrating the nonvolatile memory device 120 of FIG. 1.

Referring to FIGS. 1 and 3, the nonvolatile memory device 120 may include a memory cell array 121, an address decoder 122, a control logic circuit 123, a page buffer circuit 124, and an input/output (I/O) circuit 125.

The memory cell array 121 may include the plurality of memory blocks BLK1 to BLKm. Each of the memory blocks BLK1 to BLKm may include a plurality of cell strings, each of which includes a plurality of memory cells connected in series. The plurality of memory cells may be connected with a plurality of word lines WL. Each of the memory cells may be a single level cell (SLC) storing one bit or a multi-level cell (MLC) storing at least two bits.

The address decoder 122 may be connected with the memory cell array 121 through string selection lines SSL, the word lines WL, and ground selection lines GSL. The address decoder 122 may receive an address ADDR from the memory controller 110 and may control voltages of the string selection lines SSL, the word lines WL, and the ground selection lines GSL based on the received address ADDR.

The control logic circuit 123 may receive a command CMD and a control signal CTRL from the memory controller 110 and may control the address decoder 122, the page buffer circuit 124, and the input/output circuit 125 based on the received signals.

The page buffer circuit 124 is connected with the memory cell array 121 through bit lines BL. The page buffer circuit 124 may receive data from the input/output circuit 125 through data lines DL and may temporarily store the received data. Alternatively, the page buffer circuit 124 may read data "DATA" from the memory cell array 121 through the bit lines BL and may provide the read data "DATA" to the input/output circuit 125 through the data lines DL. The input/output circuit 125 may exchange data "DATA" with the memory controller 110.

Figure 4:
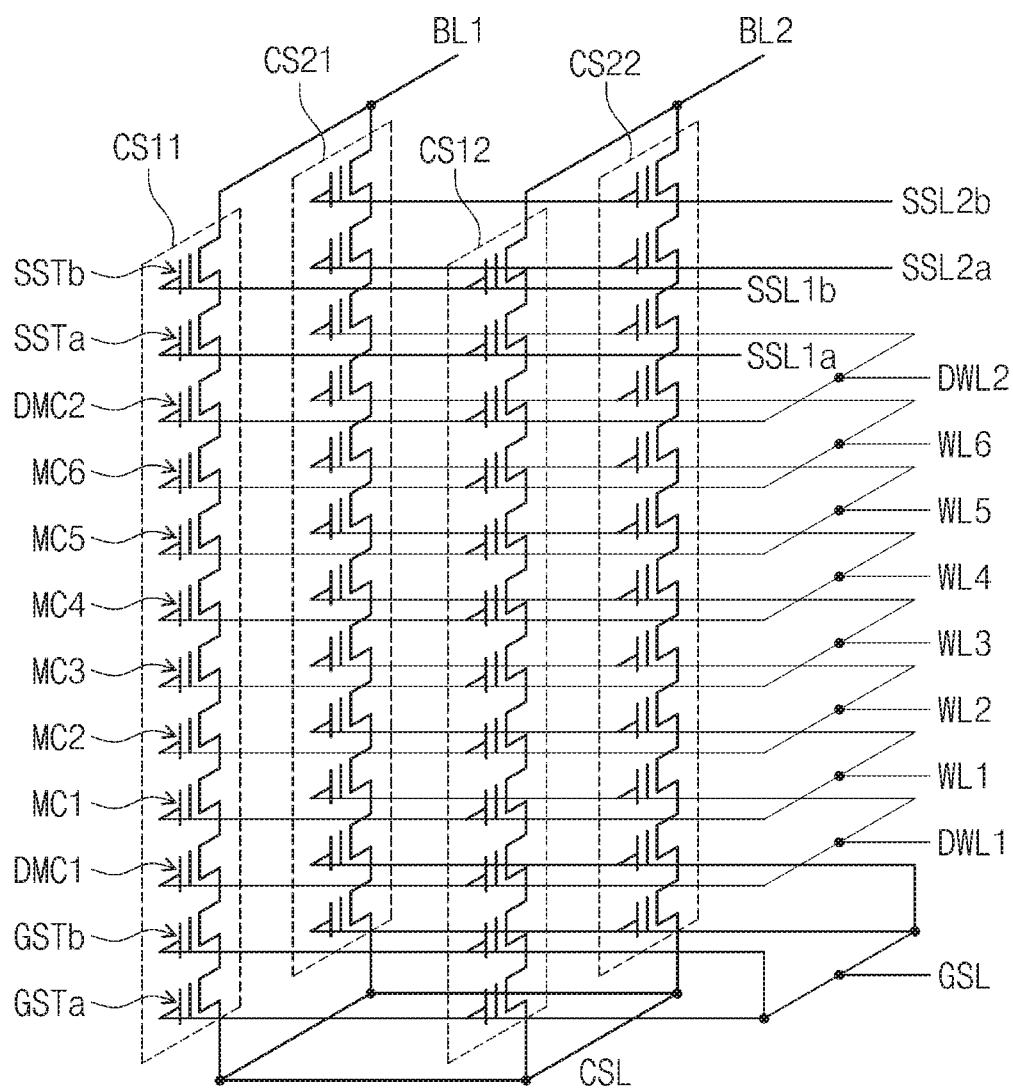
FIG. 4 is an equivalent circuit diagram illustrating a first memory block of FIG. 3.

FIG. 4 is an equivalent circuit diagram illustrating a first memory block BLK1 of FIG. 3. The first memory block BLK1 will be described with reference to FIG. 4. However, the remaining memory blocks may have the same structure as the first memory block BLK1.

In an example embodiment, the memory block BLK illustrated in FIG. 4 may be a physical erase unit of the nonvolatile memory device 120. However, example embodiments of the inventive concepts may not be limited thereto. For example, an erase unit may be changed to a page unit, a word line unit, a sub block unit, etc.

Referring to FIG. 4, the first memory block BLK1 may include a plurality of cell strings CS11, CS12, CS21, and CS22. The cell strings CS11, CS12, CS21, and CS22 may be arranged along a row direction and a column direction to form rows and columns.

Each of the cell strings CS11, CS12, CS21, and CS22 may include a plurality of cell transistors. For example, each of the cell strings CS11, CS12, CS21, and CS22 may include string selection transistors SSTa and SSTb, a plurality of memory cells MC1 to MC6, ground selection transistors GSTa and GSTb, and dummy memory cells DMC1 and DMC2. In an example embodiment, each of the memory cells included in the cell strings CS11, CS12, CS21, and CS22 may be a charge trap flash (CTF) memory cell.

The plurality of memory cells MC1 to MC6 may be serially connected and may be stacked in a direction perpendicular to a plane defined by the row direction and the column direction, that is, in a height direction. In each cell string, the string selection transistors SSTa and SSTb may be serially connected and may be arranged between the memory cells MC1 to MC6 and the corresponding one of bit lines BL1 and BL2. The ground selection transistors GSTa and GSTb may be serially connected and may be arranged between the memory cells MC1 to MC6 and a common source line CSL.

In an example embodiment, the first dummy memory cell DMC1 may be arranged between the memory cells MC1 to MC6 and the ground selection transistors GSTa and GSTb. In an example embodiment, the second dummy memory cell DMC2 may be arranged between the memory cells MC1 to MC6 and the string selection transistors SSTa and SSTb.

The ground selection transistors GSTa and GSTb of the cell strings CS11, CS12, CS21, and CS22 may be connected in common to a ground selection line GSL. In an example embodiment, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

In an example embodiment, although not illustrated in FIG. 4, ground selection transistors provided at the same height from a substrate (not illustrated) may be connected to the same ground selection line, and ground selection transistors provided at different heights may be connected to different ground selection lines.

Memory cells of the same height from the substrate or the ground selection transistors GSTa and GSTb may be connected in common to the same word line, and memory cells of different heights therefrom may be connected to different word lines. For example, the memory cells MC1 to MC6 of the cell strings CS11, CS12, CS21, and CS22 may be connected to first to sixth word lines WL1 to WL6.

First string selection transistors, which belong to the same row, from among the first string selection transistors SSTa at the same height may be connected to the same string selection line, and first string selection transistors belonging to different rows may be connected to different string selection lines. For example, the first string selection transistors SSTa of the cell strings CS11 and CS12 in the first row may be connected in common to the string selection line SSL1$a$, and the first string selection transistors SSTa of the cell strings CS21 and CS22 in the second row may be connected in common to the string selection line SSL2$a$.

Likewise, second string selection transistors, which belong to the same row, from among the second string selection transistors SSTb at the same height may be connected to the same string selection line, and second string selection transistors in different rows may be connected to different string selection lines. For example, the second string selection transistors SSTb of the cell strings CS11 and CS12 in the first row may be connected in common to a string selection line SSL1$b$, and the second string selection transistors SSTb of the cell strings CS21 and CS22 in the second row may be connected in common to a string selection line SSL2$b$.

In an example embodiment, dummy memory cells at the same height may be connected with the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2.

The first memory block BLK1 illustrated in FIG. 4 may be an example. For example, the number of cell strings may increase or decrease, and the number of rows of cell strings and the number of columns of cell strings may increase or decrease depending on the number of cell strings. Also, in the memory block BLK1, the number of cell transistors (GST, MC, DMC, SST, etc.) may increase or decrease, and a height of the memory block BLK1 may increase or decrease depending on the number of cell transistors. Also, the number of lines (GSL, WL, DWL, SSL, etc.) connected with the cell transistors may increase or decrease depending on the number of the cell transistors.

Figure 5:
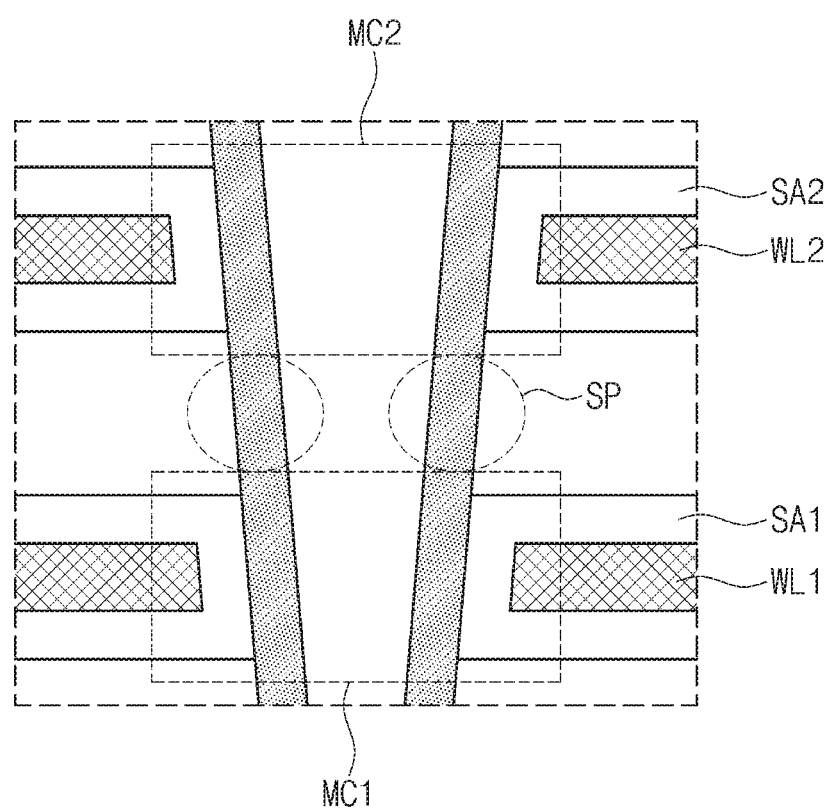
FIG. 5 is a sectional view illustrating a structure of first and second memory cells of FIG. 4.

FIG. 5 is a sectional view illustrating a structure of first and second memory cells of FIG. 4.

Referring to FIGS. 4 and 5, the charge loss and the charge gain will be more fully described with reference to FIG. 5.

In an example embodiment, the sectional view of FIG. 5 is a sectional view of the first and second memory cells MC1 and MC2 taken along a direction perpendicular to a substrate. However, the structure of memory cells illustrated in FIG. 5 is only an example, and the scope and spirit of example embodiments of the inventive concepts are not limited thereto. Also, components that are unnecessary to describe the charge loss and the charge gain are omitted in FIG. 5.

The first and second memory cells MC1 and MC2 may be stacked in a direction perpendicular to a substrate (not illustrated). The memory cell MC1 is connected with a first word line WL1, and the second memory cell MC2 is connected with a second word line WL2. Threshold voltages of the first and second memory cells MC1 and MC2 may vary as electrons (or holes) are accumulated in first and second storage areas SA1 and SA2 of the first and second memory cells MC1 and MC2.

That is, electrons (or holes) may be accumulated in the first and second storage areas SA1 and SA2 by controlling voltages of the first and second word lines WL1 and WL2 depending on data to be stored in the first and second memory cells MC1 and MC2, and thus, the threshold voltages of the first and second memory cells MC1 and MC2 may vary. Data stored in the first and second memory cells MC1 and MC2 may be sensed on the basis of the threshold voltages of the first and second memory cells MC1 and MC2.

In an example embodiment, in the case where a time elapses in a state where data are stored in the first and second memory cells MC1 and MC2, electrons (or holes) accumulated in the first and second storage areas SA1 and SA2 may be diffused to a space SP (or a channel) between the first and second memory cells MC1 and MC2. That is, electrons (or holes) may be accumulated in the space SP depending on states of the first and second memory cells MC1 and MC2. In the case where the first and second memory cells MC1 and MC2 are again programmed in a state where electrons (or holes) are accumulated in the space SP, the electrons (or holes) accumulated in the space SP may have an influence on electrons (or holes) accumulated in the first and second storage areas SA1 and SA2 of the first and second memory cells MC1 and MC2, thereby causing a change in threshold voltages of the first and second memory cells MC1 and MC2. That is, the reliability of data stored in the first and second memory cells MC1 and MC2 may decrease due to electrons (or holes) accumulated in the space SP.

In detail, it is assumed that electrons are accumulated in the space SP. Under the assumption, data may be programmed in the first and second memory cells MC1 and MC2. As a time elapses, electrons may be additionally accumulated in the first and second storage areas SA1 and SA2 of the first and second memory cells MC1 and MC2 by the electrons accumulated in the space SP. Threshold voltages of the first and second memory cells MC1 and MC2 may increase due to charges accumulated in the first and second storage areas SA1 and SA2. Since the threshold voltages of the first and second memory cells MC1 and MC2 increase, data stored in the first and second memory cells MC1 and MC2 may not be sensed normally. This phenomenon may be the above-described "charge gain (C/G) phenomenon".

As another example, it is assumed that holes are accumulated in the space SP. Under the assumption, data may be programmed in the first and second memory cells MC1 and MC2. As a time elapses, electrons of the first and second storage areas SA1 and SA2 of the first and second memory cells MC1 and MC2 may decrease or diffuse by the holes accumulated in the space SP. Threshold voltages of the first and second memory cells MC1 and MC2 may decrease due to charge reduction or diffusion of the first and second storage areas SA1 and SA2. Since the threshold voltages of the first and second memory cells MC1 and MC2 decrease, data stored in the first and second memory cells MC1 and MC2 may not be sensed normally. This phenomenon may be the above-described "charge loss (C/L) phenomenon".

That is, in the first memory block BLK1, in the case where electrons are accumulated in the space SP between memory cells, threshold voltages of memory cells in the first memory block BLK1 may increase as a time elapses after data are programmed in the first memory block BLK1. In contrast, in the first memory block BLK1, in the case where holes are accumulated in the space SP between memory cells, threshold voltages of memory cells in the first memory block BLK1 may decrease as a time elapses after data are programmed in the first memory block BLK1. A state where electrons are accumulated in the space SP between memory cells may correspond to the above-described "charge gain state", and a state where holes are accumulated in the space SP between memory cells may correspond to the above-described "charge loss state".

FIGS. 6A and 6B are distribution diagrams illustrating threshold voltages of memory cells, which vary with states (i.e., a charge gain state and a charge loss state) of a memory block. In each of FIGS. 6A and 6B, an X-axis represents a threshold voltage Vth of a memory cell, and a Y-axis represents the number of memory cells. For convenience of description, it is assumed that each memory cell is a triple level cell to store 3-bit data. However, the scope and spirit of example embodiments of the inventive concepts are not limited thereto.

Referring to FIGS. 4 to 6B, each of memory cells of the first memory block BLK1 may be programmed to have one of an erase state E and first to seventh program states P1 to P7. The programmed memory cells may have the erase state E and the first to seventh program states P1 to P7 as marked by a solid line in FIGS. 6A and 6B.

In the case where the first memory block BLK1 is in the "charge gain (C/G) state" (i.e., in the case where charges are accumulated in spaces between memory cells), as a time elapses, a threshold voltage distribution of the memory cells in the first memory block BLK1 may vary as illustrated by a dotted line of FIG. 6A. That is, threshold voltages of the memory cells may increase on the whole.

In the case where the first memory block BLK1 is in the "charge loss (C/L) state" (i.e., in the case where holes are accumulated in spaces between memory cells), as a time elapses, a threshold voltage distribution of the memory cells in the first memory block BLK1 may vary as illustrated by a dotted line of FIG. 6B. That is, threshold voltages of the memory cells may decrease on the whole.

In the above-described cases, since the erase state E and the first to seventh program states P1 to P7 of memory cells are not exactly distinguished, data may not be normally sensed from the memory cells. As described above, threshold voltages of memory cells may increase or decrease depending on a state (the charge gain state or the charge loss state) of the first memory block BLK1. This may mean that the reliability of data stored in the first memory block BLK1 is reduced.

Figure 7:
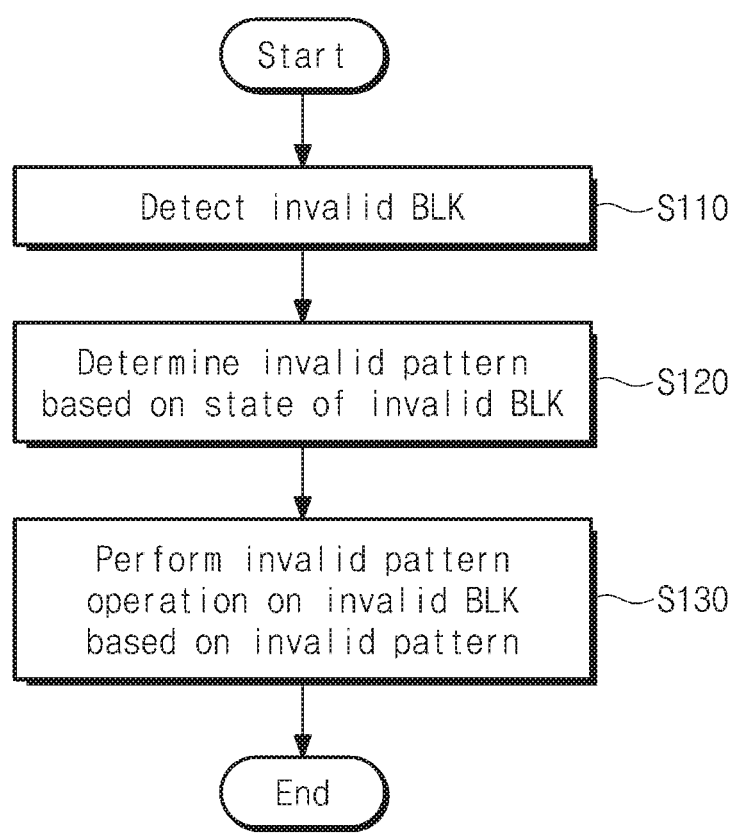
FIG. 7 is a flowchart illustrating an operation method of the memory controller of FIG. 1.
Figure 8A:
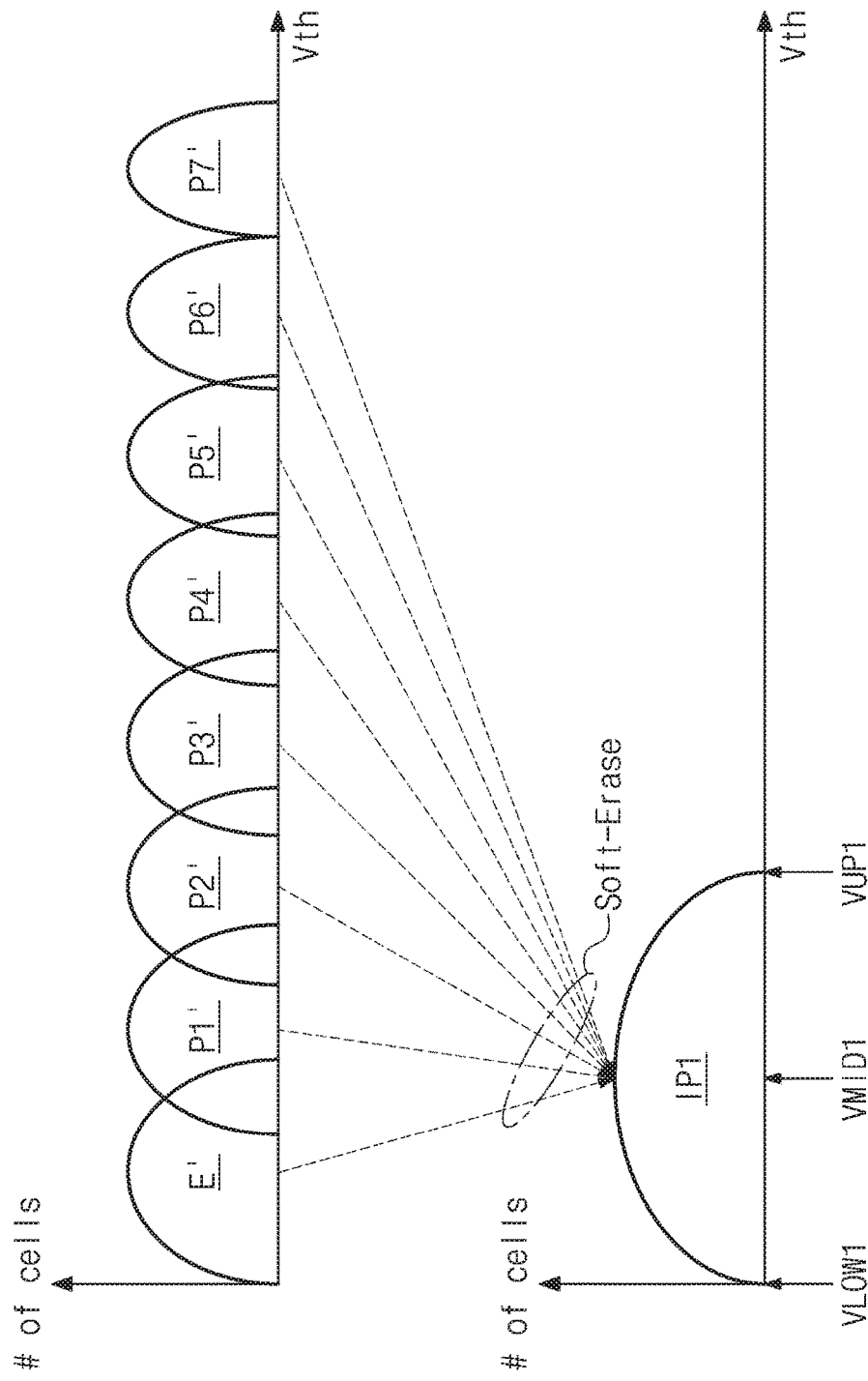
FIGS. 8A and 8B are distribution diagrams for describing an invalid pattern.
Figure 8B:
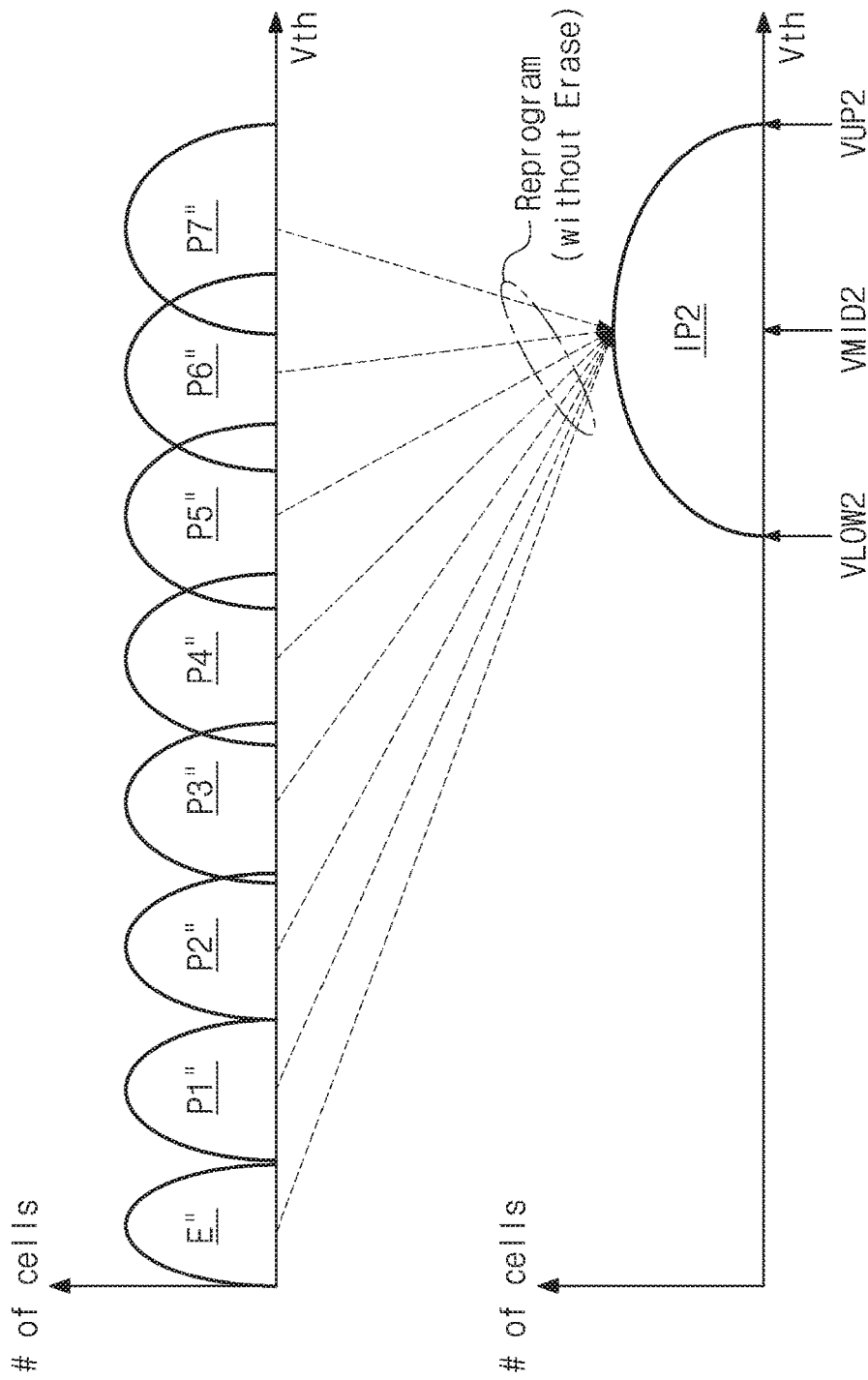

FIG. 7 is a flowchart illustrating an operation method of the memory controller 110 of FIG. 1. FIGS. 8A and 8B are distribution diagrams for describing an invalid pattern.

Referring to FIGS. 1, 7, 8A, and 8B, in operation S110, the memory controller 110 may detect an invalid block. For example, as described above, an invalid block may be generated by a maintenance operation (e.g., a garbage collection operation, a read reclaim operation, or the like) of the memory controller 110. The memory controller 110 may detect the generated invalid block.

In operation S120, the memory controller 110 may determine an invalid pattern based on a state of the invalid block. For example, the memory controller 110 may detect whether the invalid block is in the charge gain state or in the charge loss state through various manners. The memory controller 110 may determine an invalid pattern based on a state of the invalid block.

In operation S130, the memory controller 110 may perform an invalid pattern operation on the invalid block, based on the determined invalid pattern. For example, the memory controller 110 may perform a program operation, a reprogram operation, a soft-program operation, an erase operation, a soft-erase operation, a program operation after erase, an erase operation after reprogram, or the like on the invalid block such that the invalid block has the invalid pattern. Below, for convenience of description, an operation of allowing an invalid block to have an invalid pattern (in other words, allowing memory cells of the invalid block to have a threshold voltage distribution corresponding to the invalid pattern) is referred to as an "invalid pattern operation". The invalid pattern operation may include at least one of the above-described operations associated with the invalid block.

In an example embodiment, if the invalid pattern operation is performed on the invalid block to have the determined invalid pattern, it may be possible to offset a state (i.e., the charge loss state or the charge gain state) of the invalid block.

For example, as illustrated in FIG. 8A, in the case where the invalid block is in the charge gain state, each of memory cells of the invalid block may have one of an erase state E' and program states P1' to P7'. In this case, the invalid pattern operation may be performed such that the invalid block BLK1 has a first invalid pattern IP1. The first invalid pattern IP1 may be a threshold voltage distribution having a first lower limit value VLOW1, a first upper limit value VUP1, and a first middle value VMID1. The first lower limit value VLOW1, the first upper limit value VUP1, and the first middle value VMID1 may be relatively low voltage values. That is, the memory controller 110 may perform a soft-erase operation on an invalid block to allow the invalid block to have the first invalid pattern IP1.

If the invalid block of the charge gain state is left in a state of the first invalid pattern IP1, charges accumulated in spaces between memory cells may decrease or may be offset. For example, since the first invalid pattern IP1 is a relatively low threshold voltage distribution, a relatively small quantity of charges (a relatively large quantity of holes) may be included in a storage area of each memory cell of the invalid block having the first invalid pattern IP1. As the invalid block is left in such a state, charges accumulated between memory cells of the invalid block may be offset. Accordingly, in the case where data are programmed in the invalid block later, since charges accumulated between memory cells of the invalid block decrease, the charge gain phenomenon may decrease or may be offset.

As illustrated in FIG. 8B, in the case where an invalid block is in the charge loss state, each of memory cells of the invalid block may have one of an erase state E" and program states P1" to P7". In this case, the invalid pattern operation may be performed such that the invalid block has a second invalid pattern IP2. The second invalid pattern IP2 may be a threshold voltage distribution having a second lower limit value VLOW2, a second upper limit value VUP2, and a second middle value VMID2. The second lower limit value VLOW2, the second upper limit value VUP2, and the second middle value VMID2 may be relatively high voltage values. That is, the memory controller 110 may perform a reprogram operation (in this case, an erase operation is not performed) on an invalid block to allow the invalid block to have the second invalid pattern IP2.

If the invalid block of the charge loss state is left in a state of the second invalid pattern IP2, holes accumulated in spaces between memory cells may decrease or may be offset. For example, since the second invalid pattern IP2 is a relatively high threshold voltage distribution, a relatively large quantity of charges may be included in a storage area of each memory cell of the invalid block having the second invalid pattern IP2. As the invalid block is left in such a state, holes accumulated between memory cells of the invalid block may be offset. Accordingly, in the case where data are programmed in the invalid block later, since holes accumulated between memory cells of the invalid block decrease, the charge loss phenomenon may decrease or may be offset.

As described above, as an invalid block is left in a state where the invalid block has an invalid pattern determined according to the charge loss state or the charge gain state, the reliability of data to be programmed in the invalid block later may be secured.

Figure 9A:
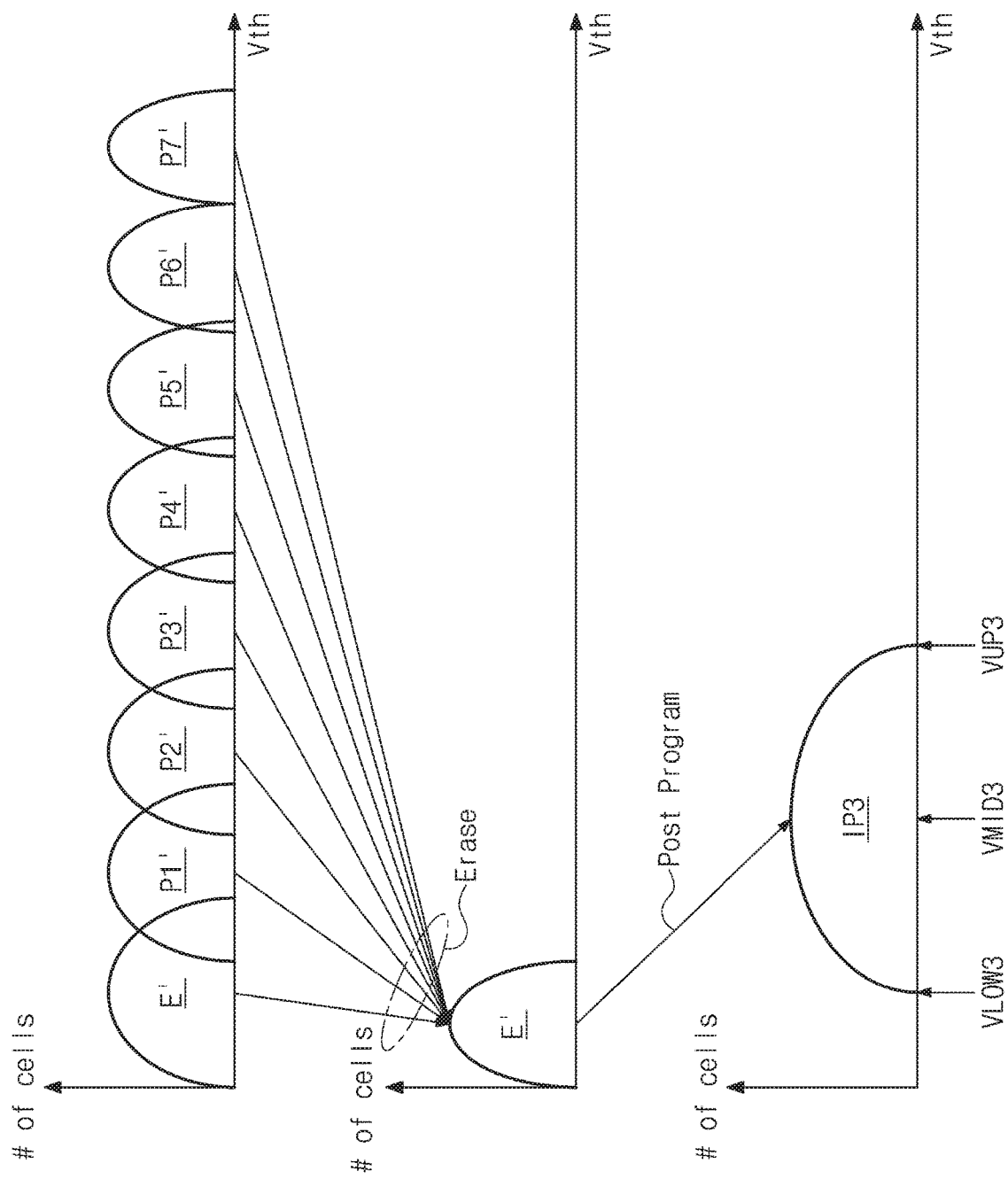

FIGS. 9A and 9B are distribution diagrams for describing various invalid patterns. In each of FIGS. 9A and 9B, an X-axis represents a threshold voltage Vth of a memory cell, and a Y-axis represents the number of memory cells. In an example embodiment, the soft-erase operation and the reprogram operation are described with reference to FIGS. 8A and 8B. Below, another invalid pattern operation will be described with reference to FIGS. 9A and 9B.

Referring to FIG. 9A, in the case where an invalid block is in the charge gain state, each of memory cells of the invalid block may have one of the erase state E' and the program states P1' to P7'. In this case, if the invalid pattern operation is performed, memory cells of the invalid block may be first erased to have the erase state E, and then, may be post-programmed to have a third invalid pattern IP3. The third invalid pattern IP3 may have a third lower limit value VLOW3, a third upper limit value VUP3, and a third middle value VMID3.

Referring to FIG. 9B, in the case where an invalid block is in the charge loss state, each of memory cells of the invalid block may have one of the erase state E" and the program states P1" to P7". In this case, if the invalid pattern operation is performed, memory cells of the invalid block may be first reprogrammed to have the seventh program state P7" (in this case, an erase operation is not performed), and then, may be post-erased to have a fourth invalid pattern IP4. The fourth invalid pattern IP4 may have a fourth lower limit value VLOW4, a fourth upper limit value VUP4, and a fourth middle value VMID4.

The above-described invalid pattern operation is only an example, and the scope and spirit of example embodiments of the inventive concepts are not limited thereto. The invalid pattern operation may be performed through various manners such that an invalid block has a determined invalid pattern. In an example embodiment, the invalid pattern operation may include various operations for an invalid block, such as a program operation, a soft-program operation, a reprogram operation, an erase operation, a soft-erase operation, a soft-program operation after erase, a soft-erase operation after program, and the like.

Figure 10:
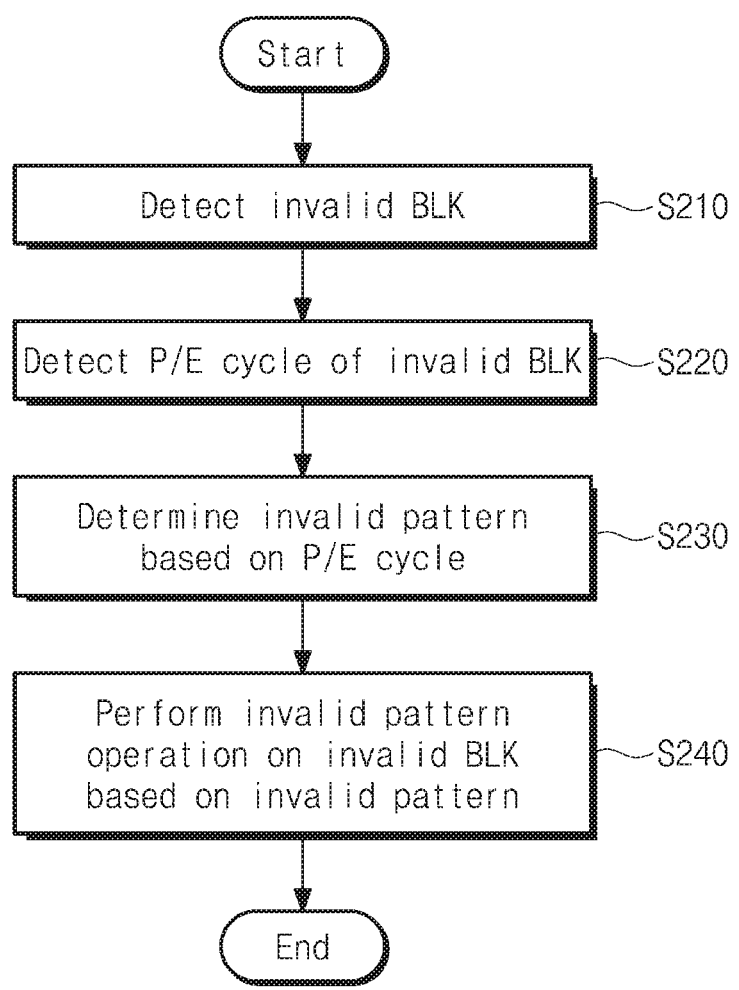
FIG. 10 is a flowchart illustrating an operation of the memory controller of FIG. 1.

FIG. 10 is a flowchart illustrating an operation of the memory controller 110 of FIG. 1.

Referring to FIGS. 1 and 10, in operation S210, the memory controller 110 may detect an invalid block. Operation S210 is similar to operation S110 of FIG. 7, and thus, a detailed description thereof will not be repeated here.

In operation S220, the memory controller 110 may detect the number of program/erase (P/E) cycles of an invalid block. For example, the memory controller 110 manage information about the number of P/E cycles for each of the memory blocks BLK1 to BLKm for the purpose of managing the wearing levels of the memory blocks BLK1 to BLKm of the nonvolatile memory device 120. The memory controller 110 may detect the number of P/E cycles for the invalid block based on the information about the number of P/E cycles.

In operation S230, the memory controller 110 may determine an invalid pattern based on the number of P/E cycles of the invalid block. For example, holes accumulated in the space SP (refer to FIG. 5) of a memory block may increase as the number of P/E cycles of the memory block increases. That is, as the number of P/E cycles of the invalid block increases, a state of the invalid block may change to a stronger charge loss state.

In an example embodiment, the stronger charge loss state refers to a state where threshold voltages of memory cells are more quickly or much more reduced after programmed. For example, assuming that a threshold voltage of a memory cell decreases as much as a first value during a first time in a first charge loss state, in a second charge loss state stronger than the first charge loss state, a threshold voltage of a memory cell may decrease as much as a second value greater than the first value during the first time. This means that the number of quantity of holes accumulated in a space of a memory block is greater as the charge loss state is stronger.

As described above, the memory controller 110 may increase a lower limit value, an upper limit value, or a middle value of the invalid pattern IP as the number of P/E cycles of the invalid block increases, thereby making it possible to offset or reduce a state of the invalid block.

Afterwards, the memory controller 110 may perform operation S240. Operation S240 is similar to operation S130 of FIG. 7, and thus, a detailed description thereof will not be repeated here.

Figure 12:
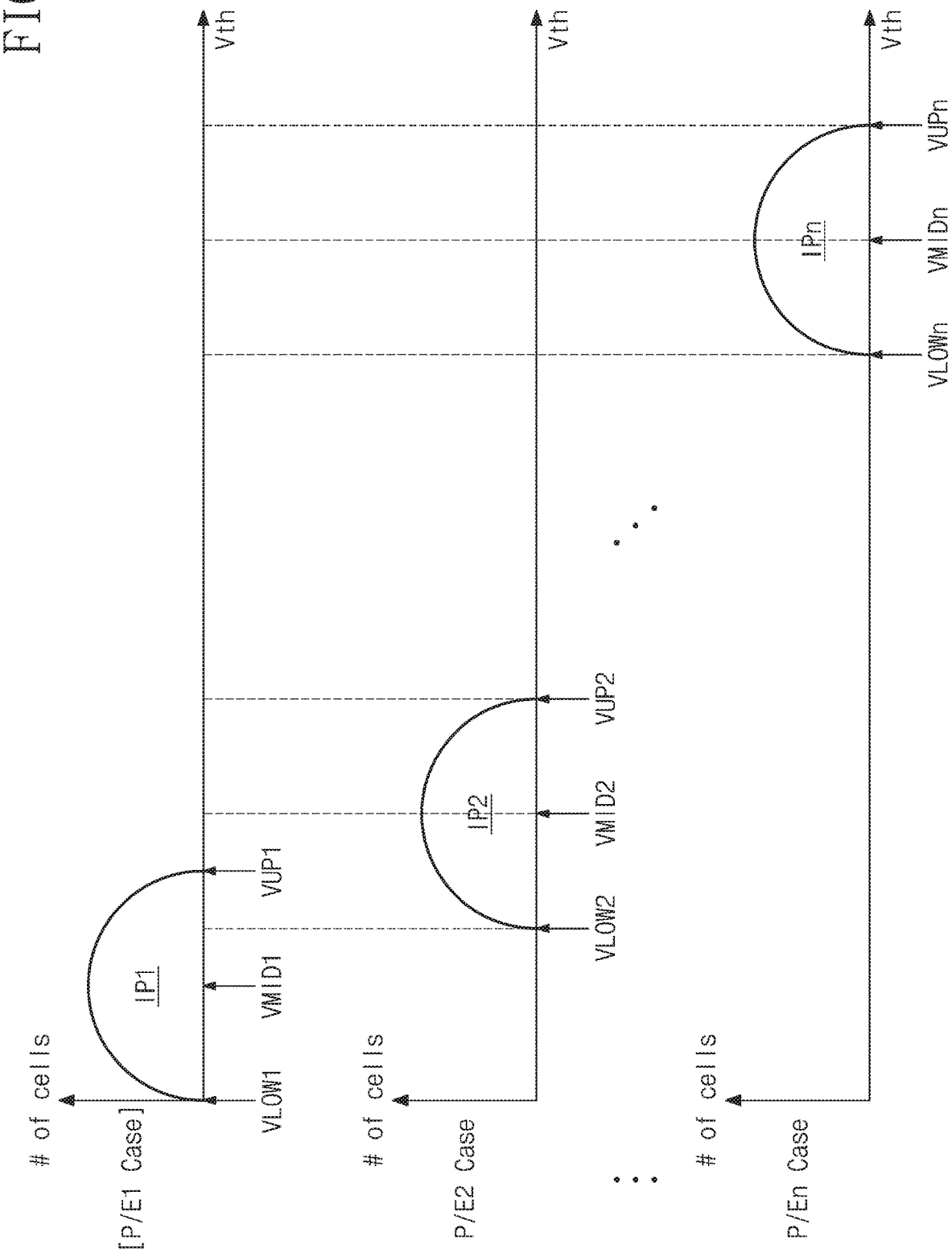
FIG. 12 is a distribution diagram illustrating threshold voltage distributions respectively corresponding to invalid patterns included in the look-up table of FIG. 11.

FIG. 11 is a look-up table illustrating an invalid pattern corresponding to the number of P/E cycles of an invalid block. FIG. 12 is a distribution diagram illustrating threshold voltage distributions respectively corresponding to invalid patterns included in a look-up table of FIG. 11.

Referring to FIGS. 1 and 10 to 12, the memory controller 110 may detect the number of P/E cycles of an invalid block.

As described above, the memory controller 110 may detect the number of P/E cycles of the invalid block from information about the number of P/E cycles of each of the memory blocks BLK1 to BLKm.

The memory controller 110 may determine an invalid pattern corresponding to the detected number of P/E cycles from the look-up table LUT. For example, the look-up table LUT may include information about a plurality of invalid patterns IP1 to IPn respectively corresponding to the numbers of P/E cycles P/E1 to P/En. In an example embodiment, each of the numbers of P/E cycles P/E1 to P/En may indicate a specific value of a P/E cycle or may indicate a range of a P/E cycle. In an example embodiment, the look-up table LUT may be stored in the RAM 113 (refer to FIG. 2) of the memory controller 110 or in a separate storage circuit.

In the case where the detected number of P/E cycles is smaller than the first number of P/E cycles P/E1, the memory controller 110 may determine the first invalid pattern IP1 as an invalid pattern to be formed in the invalid block. In this case, the first invalid pattern IP1 may have a first lower limit value VLOW1, a first upper limit value VUP1, and a first middle value VMID1 as illustrated in FIGS. 11 and 12.

In the case where the detected number of P/E cycles is greater than the first number of P/E cycles P/E1 and is smaller than the second number of P/E cycles P/E2, the memory controller 110 may determine the second invalid pattern IP2 as an invalid pattern to be formed in the invalid block. In this case, the second invalid pattern IP2 may have a second lower limit value VLOW2, a second upper limit value VUP2, and a second middle value VMID2. As illustrated in FIG. 12, the second lower limit value VLOW2, the second upper limit value VUP2, and the second middle value VMID2 of the second invalid pattern IP2 may be greater than the first lower limit value VLOW1, the first upper limit value VUP1, and the first middle value VMID1 of the first invalid pattern IP1.

Likewise, in the case where the detected number of P/E cycles is greater than the (n−1)-th number of P/E cycles P/En−1 and is smaller than the n-th number of P/E cycles P/En, the memory controller 110 may determine the n-th invalid pattern IPn as an invalid pattern to be formed in the invalid block. As in the above description, the n-th lower limit value VLOWn, the n-th upper limit value VUPn2, and the n-th middle value VMIDn of the n-th invalid pattern IN may be greater than the (n−1)-th lower limit value VLOWn−1, the (n−1)-th upper limit value VUPn−1, and the (n−1)-th middle value VMIDn−1 of the (n−1)-th invalid pattern IPn−1. In an example embodiment, the n-th number of P/E cycles P/En may be the number of P/E cycles indicating the lifespan of a memory block.

As described above, the memory controller 110 may determine an invalid pattern having a lower limit value, an upper limit value, or a middle value that are higher as the number of P/E cycles of the invalid block increases. Alternatively, the memory controller 110 may determine an invalid pattern based on the look-up table LUT including the number of P/E cycles and information about the corresponding invalid pattern.

Although not illustrated, the look-up table LUT may in advance define only a part of a lower limit value, an upper limit value, or a middle value of an invalid pattern. For example, the look-up table LUT may include only a preset middle value VMID of an invalid pattern. Alternatively, the look-up table LUT may include only a preset lower limit value VLOW of an invalid pattern. Alternatively, the look-up table LUT may include only a preset upper limit value VUP of an invalid pattern. Alternatively, depending on a level of an invalid pattern, the look-up table LUT may include only a lower limit value, may include only a lower limit value, may include only an middle value, or may include only a combination thereof.

Figure 13:
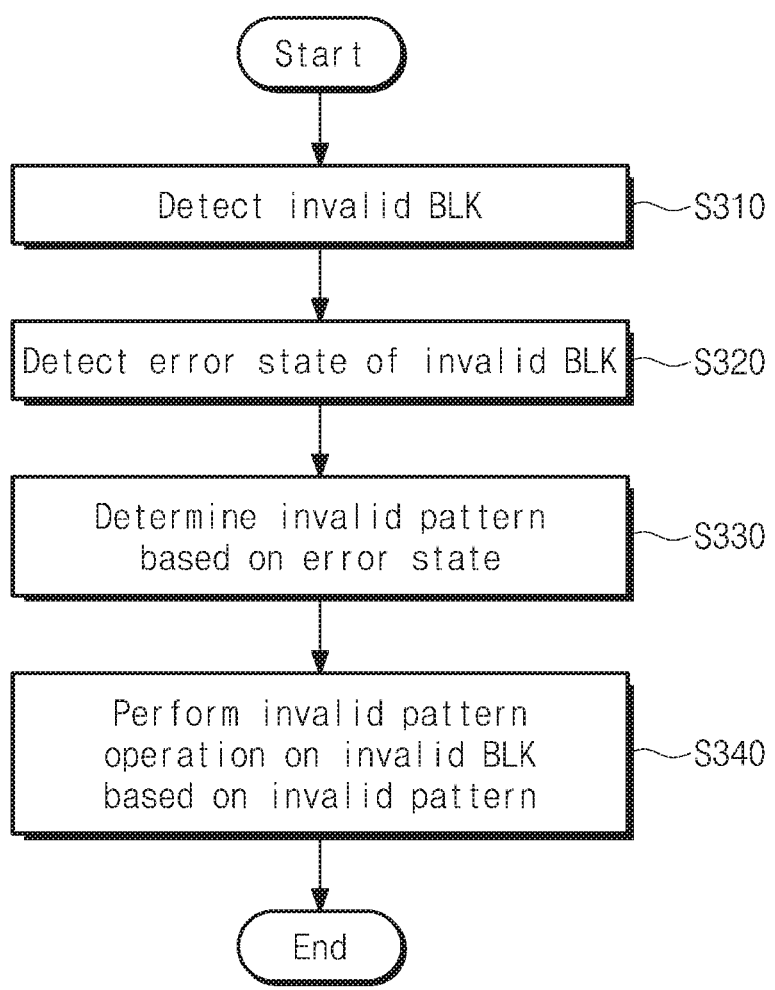
FIG. 13 is a flowchart illustrating the memory controller of FIG. 1.

FIG. 13 is a flowchart illustrating an operation of the memory controller 110 of FIG. 1. Referring to FIGS. 1 and 13, in operation S310, the memory controller 110 may detect an invalid block. Operation S310 is similar to operation S110 of FIG. 7, and thus, a detailed description thereof will not be repeated here.

In operation S320, the memory controller 110 may detect a state of an invalid block, based on error attributes of the invalid block. For example, the memory controller 110 may determine whether an error state of an invalid block is associated with an upper program state or is associated with a lower program state (i.e., error attributes), through a cell-counting operation. Alternatively, the memory controller 110 may perform error detection on data read from an invalid block through the ECC circuit 114 (refer to FIG. 2) and may determine whether the detected error is an error associated with an upper program state or an error associated with a lower program state (i.e., error attributes).

The memory controller 110 may detect a state of the invalid block based on the determined error attributes. For example, in the case where the determined error attributes are associated with an error for an upper program state, the memory controller 110 may determine that the invalid block is in the charge loss state; in the case where the determined error attributes are associated with an error for a lower program state, the memory controller 110 may determine that the invalid block is in the charge gain state.

Afterwards, the memory controller 110 may perform operation S330 and operation S340. Operation S330 and operation S340 are similar to operation S120 and operation S130 of FIG. 7, and thus, a detailed description thereof will not be repeated here.

Figure 14:
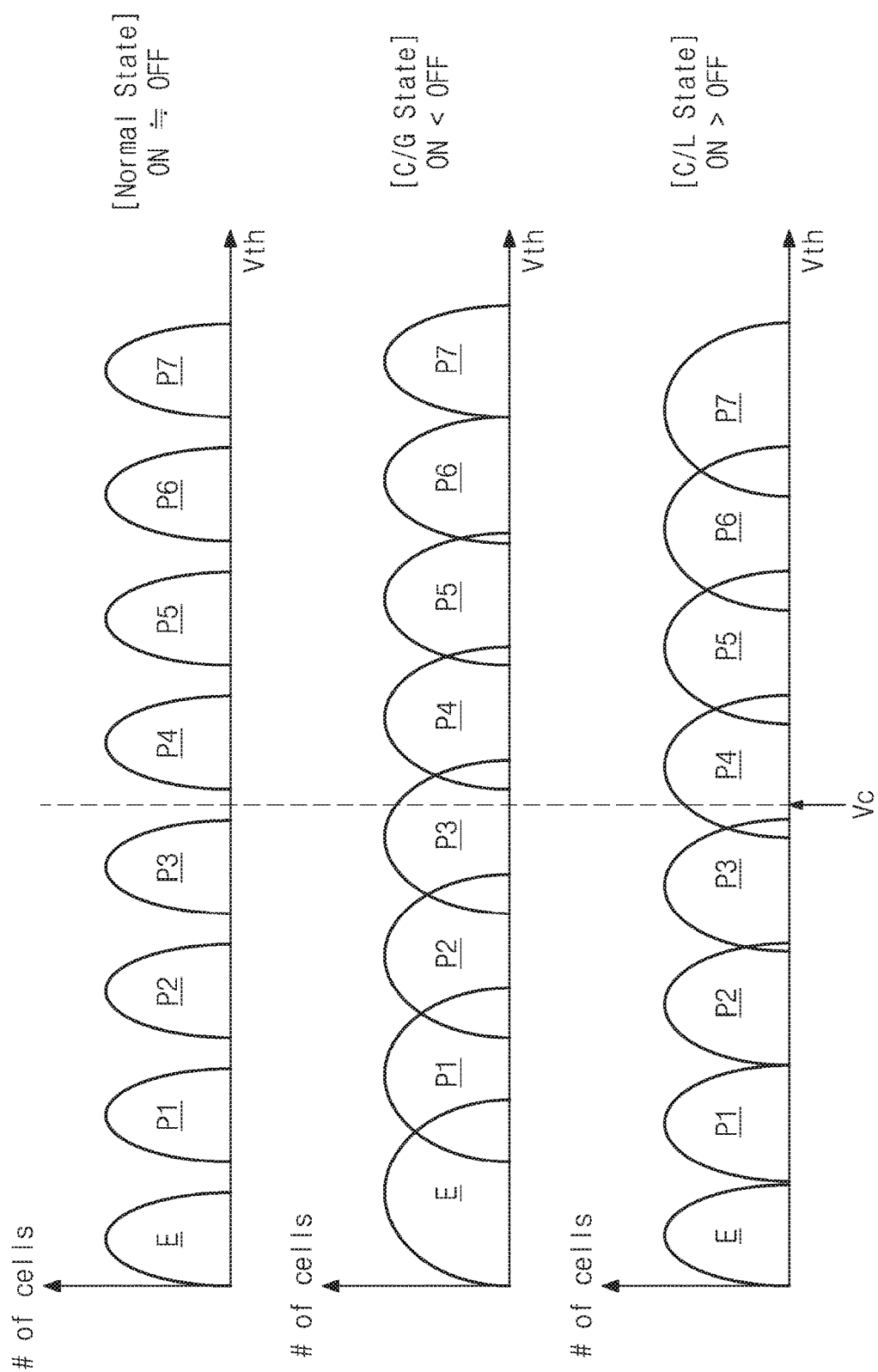
FIG. 14 is a distribution diagram for describing an example operation of detecting an error state of FIG. 13.

FIG. 14 is a distribution diagram for describing an example operation of detecting an error state of FIG. 13. For a brief description, the case where an invalid block is in the charge gain state and the case where an invalid block is in the charge loss state will be described. In an example embodiment, it is assumed that data stored in a specific page or a specific word line of an invalid block, on which cell counting is performed, are randomized data. Also, it is assumed that a counting voltage Vc corresponds to a valley value between the third program state P3 and the fourth program state P4. However, the scope and spirit of example embodiments of the inventive concepts are not limited thereto.

Referring to FIGS. 1, 13, and 14, under the control of the memory controller 110, the nonvolatile memory device 120 may apply the counting voltage Vc to a specific page or a specific word line of an invalid block to detect the number of on cells or the number of off cells. The memory controller 110 may receive a result of the detection from the nonvolatile memory device 120. As illustrated in FIG. 14, in the case where the invalid block is in a normal state (i.e., in the case where the invalid block is not in the charge loss state or the charge gain state), threshold voltages of memory cells may not be substantially changed. In this case, as illustrated in FIG. 14, the number of memory cells ON (i.e., the number of on cells) turned on by the counting voltage Vc may be substantially the same as the number of memory cells OFF (i.e., the number of off cells) turned off by the counting voltage Vc.

In the case where the invalid block is in the charge gain state, the number of memory cells ON turned on by the counting voltage Vc may be smaller than the number of memory cells OFF turned off by the counting voltage Vc. The reason is that threshold voltages of memory cells increase as a time elapses, in the invalid block that is in the charge gain state. In an example embodiment, in the charge gain state, the increment of threshold voltages of memory cells having the erase state E or a lower program state (e.g., P1, P2, or the like) may be greater than the increment of threshold voltages of memory cells having an upper program state (e.g., P6, P7, or the like). That is, in the case of the charge gain state, a greater error may occur with regard to the lower program state.

In the case where the invalid block is in the charge loss state, the number of memory cells ON turned on by the counting voltage Vc may be greater than the number of memory cells OFF turned off by the counting voltage Vc. The reason is that threshold voltages of memory cells decrease as a time elapses, in the invalid block that is in the charge loss state. In an example embodiment, in the charge loss state, the decrement of threshold voltages of memory cells having an upper program state (e.g., P6, P7, or the like) may be greater than the decrement of threshold voltages of memory cells having the erase state E or a lower program state (e.g., P1, P2, or the like). That is, in the case of the charge loss state, a greater error may occur with regard to the upper program state.

As described above, error attributes of the invalid block may vary with whether the invalid block is in the charge gain state or the charge loss state. As described above, the memory controller 110 may determine an error characteristic of an invalid block through a cell-counting operation and may determine a state of the invalid block based on the determined error attributes.

Although not illustrated in FIG. 14, the memory controller 110 may use another counting voltage. For example, a counting voltage may be set to a valley value between the first and second program states P1 and P2. In this case, the memory controller 110 may perform a cell-counting operation by using the counting voltage and may determine error attributes based on whether the cell-counting result is greater than or smaller than a preset value.

Alternatively, the memory controller 110 may perform a cell-counting operation by using at least two counting voltages. For example, the memory controller 110 may use a valley value between the first and second program states P1 and P2, a valley value between the third and fourth program states P3 and P4, and a valley value between the sixth and seventh program states P6 and P7 as counting voltages. The memory controller 110 may count the number of memory cells having threshold voltages between counting voltages, by using the above-described counting voltages and may determine a state of an invalid block (or, the error attributes) based on the counted result.

Figure 15:
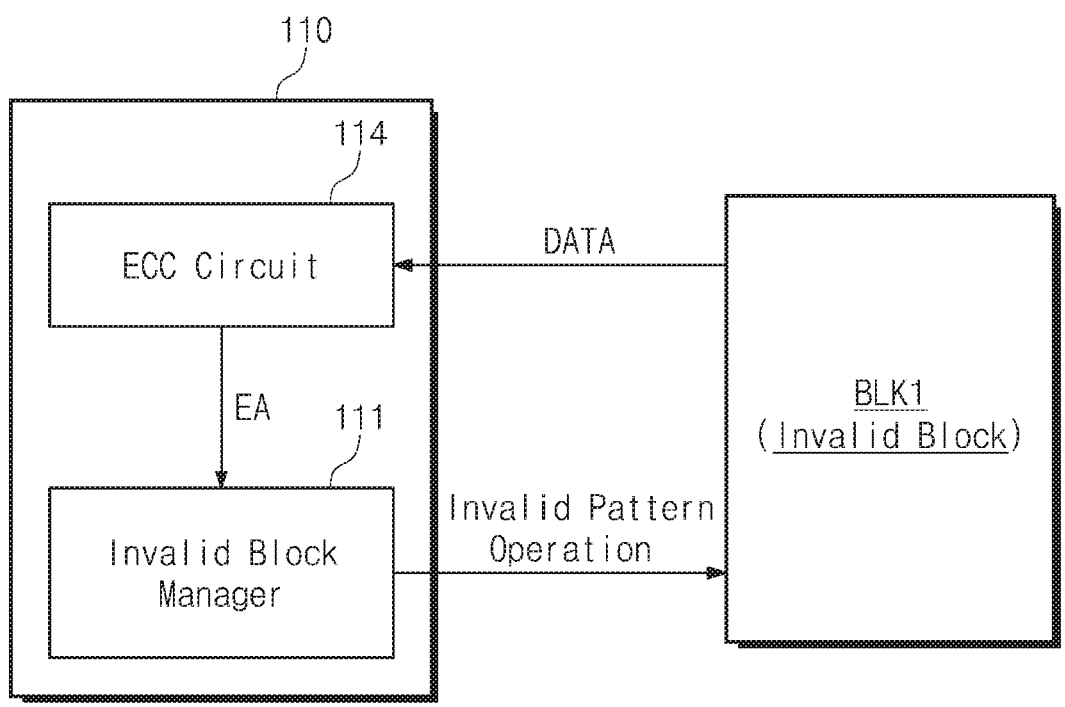
FIG. 15 is a block diagram for describing an example operation of detecting error attributes of FIG. 13.

FIG. 15 is a block diagram for describing an example operation of detecting error attributes of FIG. 13. For brevity of illustration, components that are unnecessary to describe error attributes are omitted.

Referring to FIGS. 1, 13, and 15, the memory controller 110 may read data from memory cells of a specific page, a specific word line, any page, or any word line of an invalid block. The ECC circuit 114 of the memory controller 110 may detect an error of the read data "DATA". The invalid block manager 111 may receive information EA about the detected error from the ECC circuit 114 and may determine error attributes based on the received error information EA.

For example, the invalid block manager 111 may determine an error characteristic, that is, whether the detected error is an error associated with an upper program state or an error associated with a lower program state, based on the received error information EA. The invalid block manager 111 may determine a state of an invalid block based on the determined error attributes and may determine an invalid pattern based on the state of the invalid block thus determined.

The invalid block manager 111 may perform an invalid pattern operation on the invalid block, based on the determined invalid pattern. Since the invalid pattern operation is above described, a detailed description thereof is omitted.

As described above, the memory controller 110 may detect error attributes of an invalid block and may determine a state of the invalid block based on the detected error attributes of the invalid block. The memory controller 110 may perform an invalid pattern operation on the invalid block based on the state of the invalid block, thereby improving the reliability of data to be programmed in the invalid block later.

Figure 16:
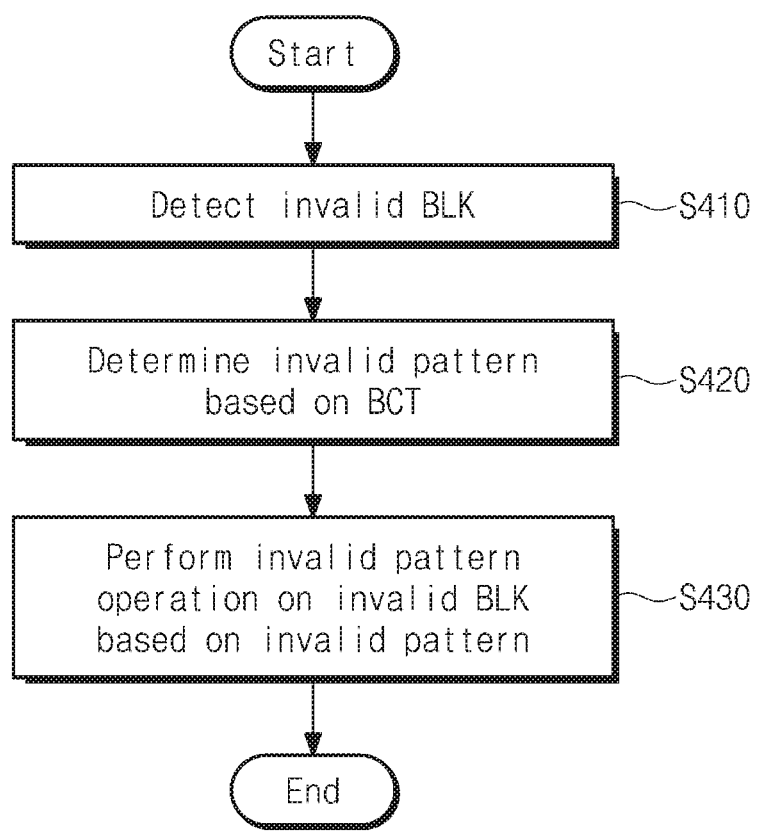
FIG. 16 is a flowchart illustrating an operation of the memory controller of FIG. 1.

FIG. 16 is a flowchart illustrating an operation of the memory controller 110 of FIG. 1.

Referring to FIG. 16, in operation S410, the memory controller 110 may detect an invalid block. Operation S410 is similar to operation S110 of FIG. 7, and a detailed description thereof will not be repeated here.

In operation S420, the memory controller 110 may determine an invalid pattern based on a block characteristic table BCT. For example, as illustrated in FIGS. 4 and 5, each of memory cells included in one memory block may have a physical characteristic that varies with a vertical height from a substrate. As illustrated in FIG. 5, the size of the first memory cell MC1 may be smaller than the size of the second memory cell MC2, and thus, an operating characteristic of the first memory cell MC1 may be different from that of the second memory cell MC2. Also, memory cells of the same height (e.g., memory cells connected with the first word line WL1 among memory cells included in the cell strings CS11, CS12, CS21, and CS22) may have different shapes. Operating characteristics of memory cells may be different from each other due to different physical characteristics or physical locations of memory cells, word lines, and memory blocks.

The block characteristic table BCT may include information of an invalid pattern that is based on a physical characteristic of each of the memory blocks BLK1 to BLKm of the nonvolatile memory device 120, a physical characteristic of each of a plurality of word lines, or a physical characteristic of each of a plurality of memory cells. That is, an invalid pattern corresponding to each memory block, each word line, or each memory cell may vary with a way to implement the block characteristic table BCT. The memory controller 110 may determine an invalid pattern corresponding to an invalid block based on the block characteristic table BCT.

Afterwards, the memory controller 110 may perform operation S430. Operation S430 is similar to operation S310 of FIG. 7, and thus, a detailed description thereof will not be repeated here.

Figure 17:
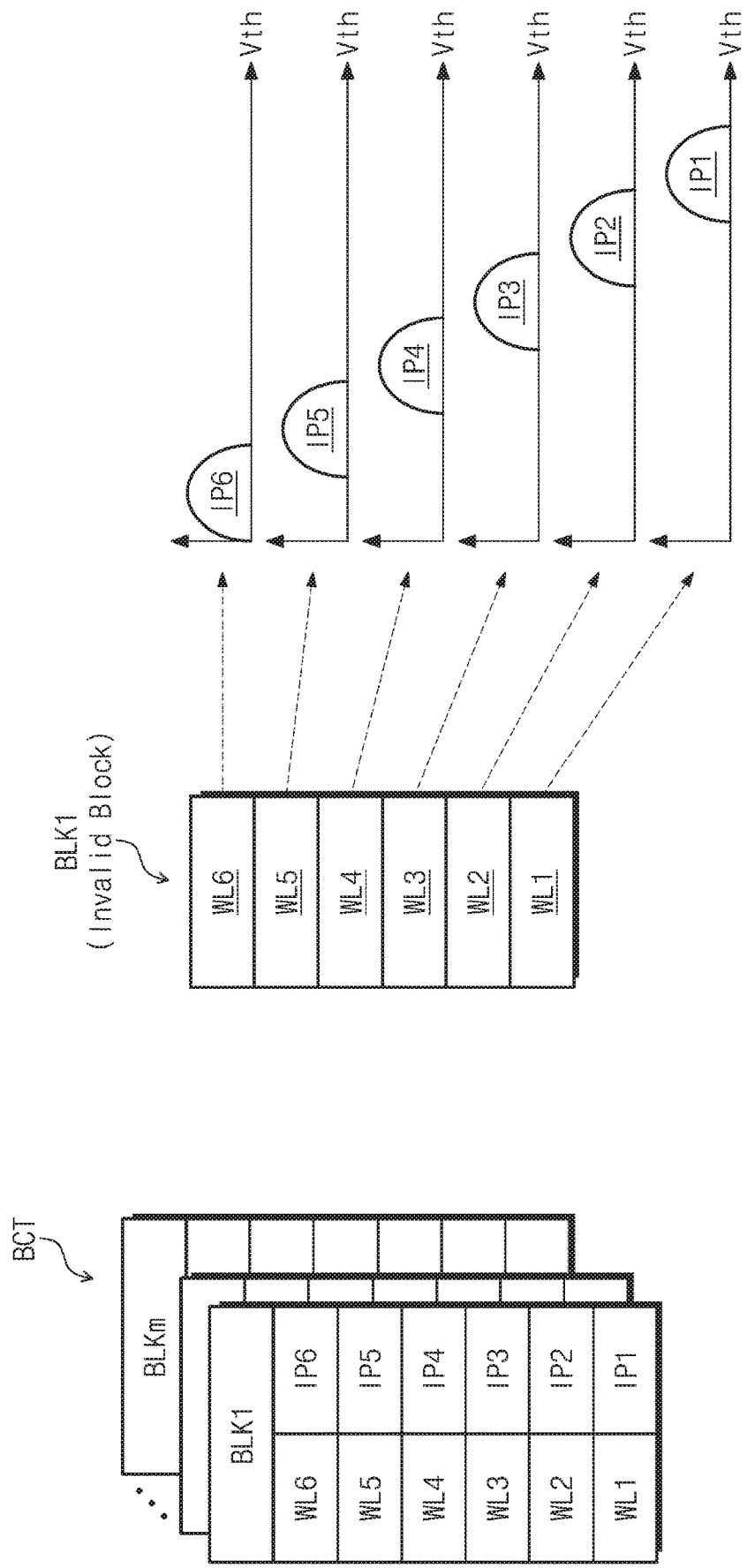
FIGS. 17 and 18 are views for describing an operation method of FIG. 16 in detail.
Figure 18:
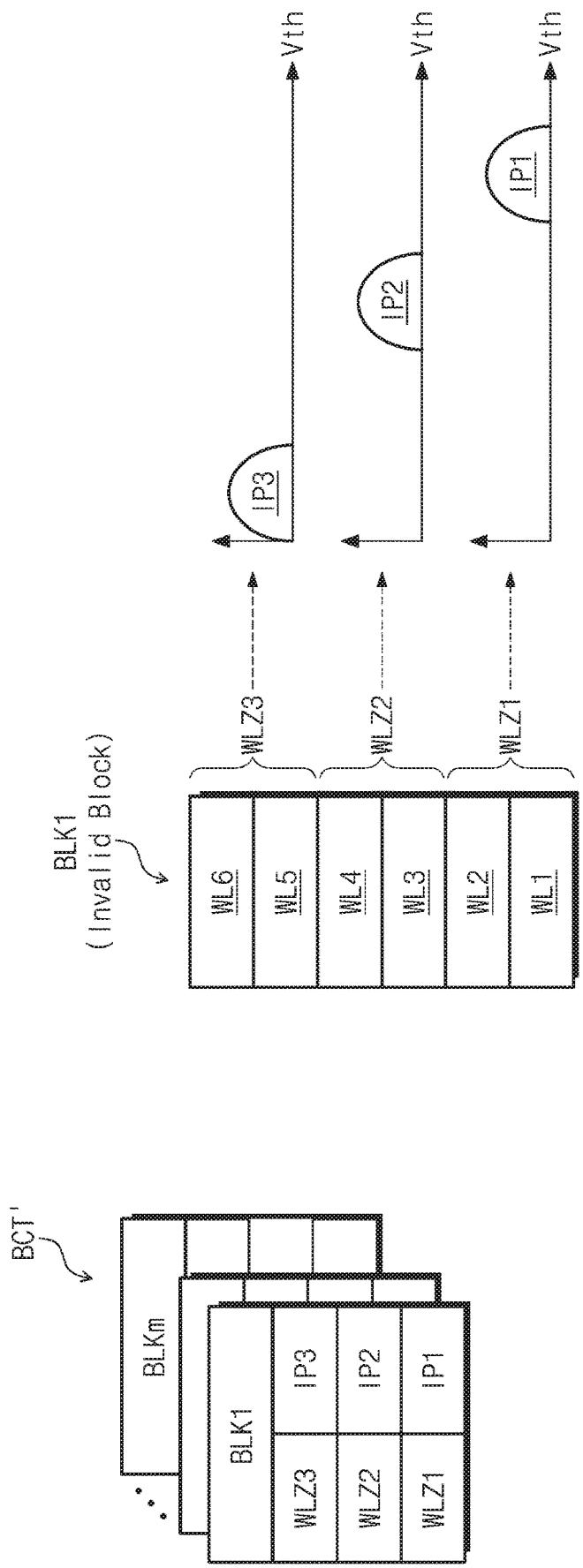

FIGS. 17 and 18 are views for describing an operation method of FIG. 16 in detail. For a brief description, components that are unnecessary to describe an operation method of FIG. 16 are omitted. Also, it is assumed that the first memory block BLK1 is an invalid block and includes the first to sixth word lines WL1 to WL6. Also, it is assumed that the block characteristic table BCT of FIG. 17 includes information of an invalid pattern corresponding to each word line.

Referring to FIGS. 1, 16, and 17, the block characteristic table BCT may include information of invalid patterns associated with the first to sixth word lines WL1 to WL6 of the respective memory blocks BLK1 to BLKm. In an example embodiment, the block characteristic table BCT may be determined through preliminary evaluation and may be stored in the RAM 113 of the memory controller 110 or in a separate storage circuit.

The memory controller 110 may determine an invalid pattern for the first memory block BLK1 being an invalid block based on the block characteristic table BCT. As illustrated in FIG. 17, the block characteristic table BCT may include information about first to sixth invalid patterns IP1 to IP6 associated with the first to sixth word lines WL1 to WL6 of the first memory block BLK1. That is, the memory controller 110 may perform an invalid pattern operation based on the block characteristic table BCT, to allow the first to sixth word lines WL1 to WL6 of the first memory block BLK1 being an invalid block to have the first to sixth invalid patterns IP1 to IP6, respectively.

In an example embodiment, assuming that the first word line WL1 is the closest word line to a substrate and the sixth word line WL6 is the highest word line from the substrate, after the invalid pattern operation, the first to sixth word lines WL1 to WL6 may respectively have the first to sixth invalid patterns IP1 to IP6 as illustrated in FIG. 17. In this case, as illustrated in FIG. 17, the first invalid pattern IP1 is higher in level than the second invalid pattern IP2, and the second invalid pattern IP2 is higher in level than the third invalid pattern IP3. Likewise, the third invalid pattern IP3 is higher in level than the fourth invalid pattern IP4, the fourth invalid pattern IP4 is higher in level than the fifth invalid pattern IP5, and the fifth invalid pattern IP5 is higher in level than the sixth invalid pattern IP6.

The charge loss characteristic may be stronger as a height of a word line from the substrate decreases. For this reason, an invalid pattern may be controlled such that a level of the invalid pattern increases as a height from the substrate decreases, thereby making it possible to offset the charge loss characteristic.

Referring to FIG. 18, a block characteristic table BCT' may include invalid pattern information associated with first to third word line zones WLZ1 to WLZ3 of the respective memory blocks BLK1 to BLKm. In an example embodiment, the first word line zone WLZ1 may include the first and second word lines WL1 and WL2, the second word line zone WLZ2 may include the third and fourth word lines WL3 and WL4, and the third word line zone WLZ3 may include the fifth and sixth word lines WL5 and WL6. However, the scope and spirit of the inventive concepts are not limited thereto.

The memory controller 110 may determine an invalid pattern for the first memory block BLK1 being an invalid block based on the block characteristic table BCT' and may perform an invalid pattern operation based on the determined invalid pattern. As illustrated in FIG. 18, after the invalid pattern operation, the first word line zone WLZ1 of the first memory block BLK1 may have the first invalid pattern IP1, the second word line zone WLZ2 of the first memory block BLK1 may have the second invalid pattern IP2, and the third word line zone WLZ3 of the first memory block BLK1 may have the third invalid pattern IP3. As in the above description, the first to third invalid patterns IP1 to IP3 may have different levels depending on heights of word lines from the substrate. A description associated with this is given above, and thus, a detailed description thereof will not be repeated here.

In an example embodiment, referring to FIGS. 17 and 18, the block characteristic tables BCT and BCT' are illustrated as invalid patterns are different from each other based on heights of word lines. However, the scope and spirit of the inventive concepts are not limited thereto. For example, as described above, memory cells connected with word lines of the same height may have different physical characteristics such as a pillar shape, a pillar size, a pillar distortion, and the like, and thus, operating characteristics (e.g., a cell speed) of memory cells may be different from each other. In this case, an invalid pattern corresponding to a upper word line may have a higher level than an invalid pattern corresponding to an lower word line. Alternatively, memory cells connected to the same word line may have different invalid patterns depending on a cell string.

As described above, the memory controller 110 may determine an invalid pattern for an invalid block based on the block characteristic table BCT that is in advance determined through preliminary evaluation. In this case, an invalid pattern may vary for each word line of an invalid block and for each memory cell of the invalid block.

Figure 19:
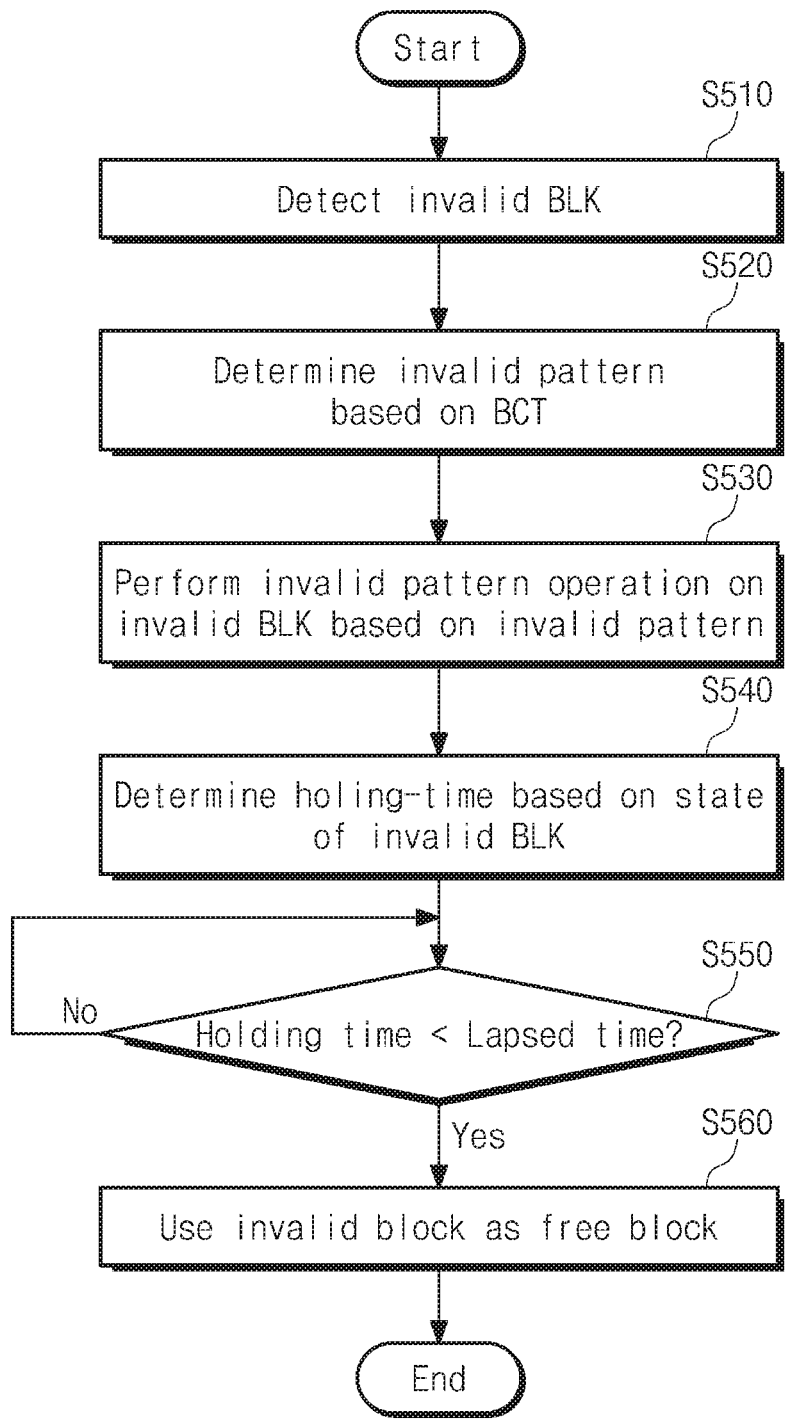
FIG. 19 is a flowchart illustrating an operation method of the memory controller of FIG. 1.

FIG. 19 is a flowchart illustrating an operation method of the memory controller 110 of FIG. 1.

Referring to FIGS. 1 and 19, the memory controller 110 may perform operation S510 to operation S530. Operation S510 to operation S530 may be similar to operation S110 to operation S130 of FIG. 7, and thus, a detailed description thereof will not be repeated here. In an example embodiment, operation S510 to operation S530 may be replaced with operation S210 to operation S240 of FIG. 10, operation S310 to operation S340 of FIG. 13, or operation S410 to operation S430 of FIG. 16. That is, the memory controller 110 may determine an invalid pattern for an invalid block through various manners and may perform an invalid pattern operation based on the determined invalid pattern.

In operation S540, the memory controller 110 may determine a holding time based on a state of the invalid block. The holding time refers to a time from a time point when a specific block is set to an invalid block to a time point when the specific block is reused (i.e., is programmed after erase). That is, the holding time refers to a time when a state of an invalid block is held.

As described above, the degree of the charge loss state or the charge gain state may vary with the number or quantity of charges or holes accumulated in the space SP (refer to FIG. 5) of an invalid block. That is, the degree of the charge gain state may increase as the number or quantity of charges accumulated in the space SP increases, and the degree of the charge loss state may increase as the number or quantity of holes accumulated in the space SP increases. As described above, that the degree of the charge gain state or the charge loss state increases means that a variation in threshold voltages of memory cells is great. The degree of the charge gain state or the charge loss state may decrease by offsetting or reducing charges or holes accumulated in the space SP of the invalid block.

In an example embodiment, the quantity of charges or holes accumulated in the space SP of the invalid block may decrease as a leaving time of the invalid block having an invalid pattern increases. That is, a characteristic of an invalid block may be offset by increasing the holding time when a state of an invalid block is held as the degree of the charge loss state or the charge gain state increases. Accordingly, the memory controller 110 may determine the holding time based on a state of the invalid block.

In operation S550, the memory controller 110 may determine whether a lapsed time exceeds the holding time. The lapsed time refers to a time from a time point when a specific block is set to an invalid block to a current time. That is, the memory controller 110 may determine whether the holding time elapses from a time point when a specific block is set to an invalid block.

If it is determined that the holding time elapses, in operation S560, the memory controller 110 may use the invalid block as a free block. For example, to write new data, the memory controller 110 may erase an invalid block, and then, may write the new data in the erased invalid block.

As described above, the memory controller 110 may make a holding time of an invalid block different depending on a state of the invalid block, thereby making it possible to effectively offset an electron gain state or an electron loss state of each invalid block. Accordingly, the reliability of the storage device 100 is improved.

Figure 20:
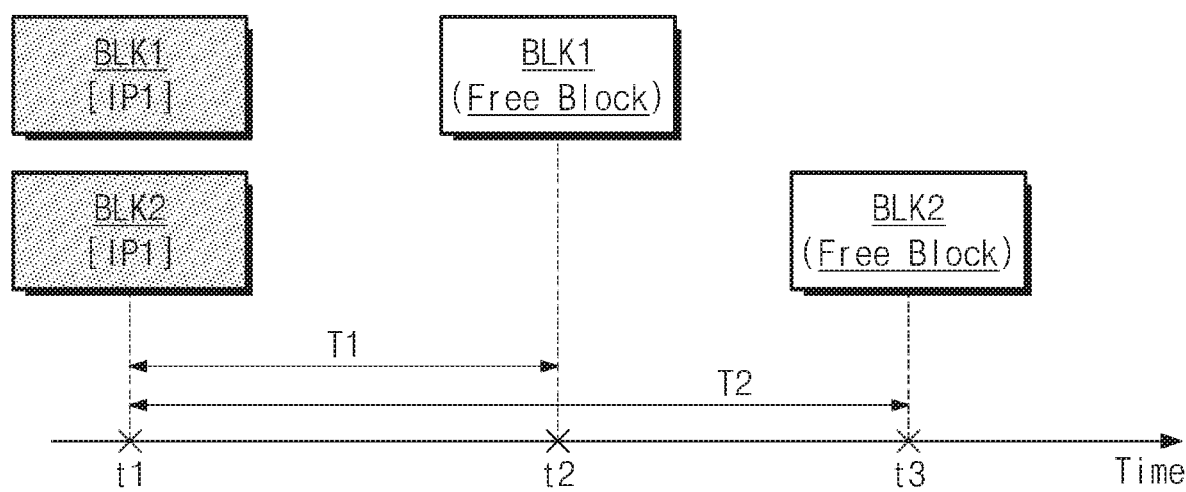
FIG. 20 is a view illustrating a reuse operation of an invalid block according to an operation method of FIG. 19.

FIG. 20 is a view illustrating a reuse operation of an invalid block according to an operation method of FIG. 19.

Referring to FIGS. 1, 19, and 20, the first and second memory blocks BLK1 and BLK2 may be detected as an invalid block at a first time point t1. It is assumed that the first and second memory blocks BLK1 and BLK2 have the first invalid pattern IP1 by an invalid pattern operation of the memory controller 110. In an example embodiment, it is assumed that the first and second memory blocks BLK1 and BLK2 are in an electron gain state and the electron gain state of the second memory block BLK2 is stronger than the electron gain state of the first memory block BLK1.

In this case, a holding time of the first memory block BLK1 may be determined as a first time T1, and a holding time of the second memory block BLK2 may be determined as a second time T2. Here, the first time T1 may be shorter than the second time T2. That is, the first memory block BLK1 may be used as a free block at a second time point t2 when the first time T1 elapses from the first time point t1, and the second memory block BLK2 may be used as a free block at a third time point t3 when the second time T2 elapses from the first time point t1.

As described above, as a holding time (or a leaving time) of an invalid block varies with a state of the invalid block, it may be possible to offset a state of the invalid block (i.e., an electron gain state or an electron loss state) influencing the reliability of data. Accordingly, the reliability of the storage device 100 is improved.

Figure 21:
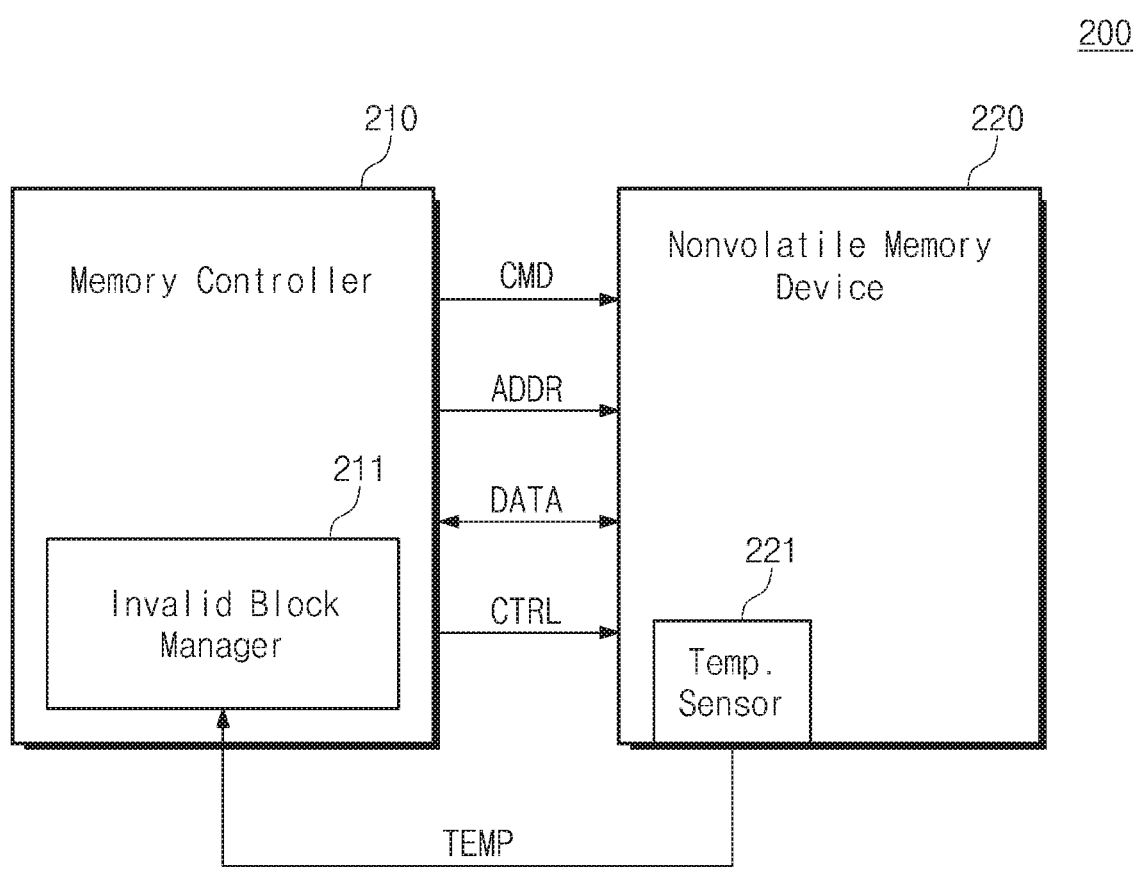
FIG. 21 is a block diagram illustrating a storage device according to an example embodiment of the inventive concepts.

FIG. 21 is a block diagram illustrating a storage device according to an example embodiment of the inventive concepts. Referring to FIG. 21, a storage device 200 may include a memory controller 210 and a nonvolatile memory device 220. The memory controller 210 may include an invalid block manager 211. The memory controller 210, the nonvolatile memory device 220, and the invalid block manager 211 are described with reference to FIGS. 1 to 20, and thus, a detailed description thereof will not be repeated here.

The nonvolatile memory device 220 may further include a temperature sensor 221. The temperature sensor 221 may detect a temperature of the nonvolatile memory device 220 and may provide information (i.e., temperature information TEMP) about the detected temperature to the invalid block manager 211 of the memory controller 210.

As described with reference to FIGS. 1 to 20, the invalid block manager 211 may determine an invalid pattern based on a state of the invalid block. In this case, the invalid block manager 211 may apply the temperature information TEMP to the determined invalid pattern. For example, electrons or holes accumulated in the space SP (refer to FIG. 5) of an invalid block may be offset quickly as a temperature of the nonvolatile memory device 220 increases. As such, in the case where a temperature increases, even though a level of an invalid pattern is increased or decreased, a state of the invalid block influencing the reliability of data may be offset.

Alternatively, the invalid block manager 211 may determine a holding time of an invalid block based on the temperature information TEMP. For example, as described above, electrons or holes accumulated in the space SP (refer to FIG. 5) of an invalid block may be offset quickly as a temperature of the nonvolatile memory device 220 increases. As such, in the case where a temperature increases, even though a holding time of an invalid pattern is decreased, a state of the invalid block influencing the reliability of data may be offset.

As described above, depending on a state of an invalid block and a temperature of the nonvolatile memory device 220, the invalid block manager 211 may determine an invalid pattern or may determine a holding time of the invalid block.

Figure 22:
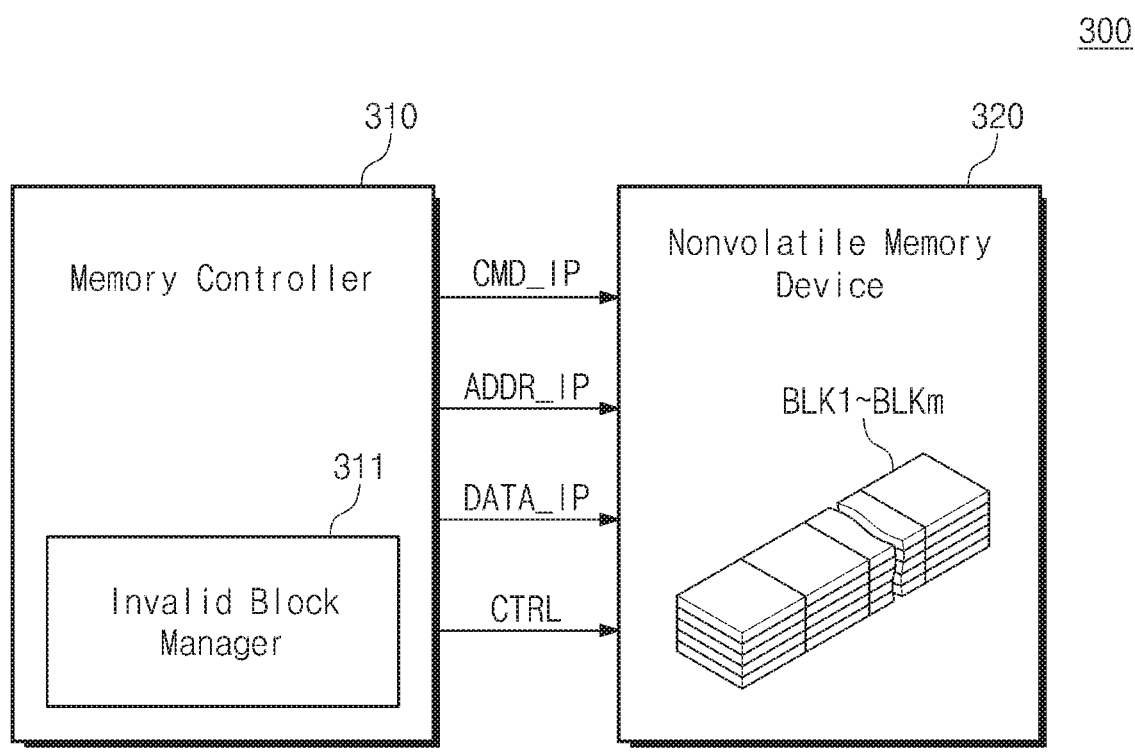
FIG. 22 is a block diagram illustrating a storage device according to an example embodiment of the inventive concepts.

FIG. 22 is a block diagram illustrating a storage device according to an example embodiment of the inventive concepts.

Referring to FIG. 22, a storage device 300 may include a memory controller 310 and a nonvolatile memory device 320. The memory controller 310 may include an invalid block manager 311. The memory controller 310, the nonvolatile memory device 320, and the invalid block manager 311 are described with reference to FIGS. 1 to 20, and thus, a detailed description thereof will not be repeated here.

To perform an invalid pattern operation on an invalid block, the memory controller 310 may transmit an invalid pattern command CMD_IP, an invalid block address ADDR_IP, invalid pattern data DATA_IP, and a control signal CTRL to the nonvolatile memory device 320.

The invalid pattern command CMD_IP may be a command for performing a program operation, a soft-program operation, a reprogram operation, an erase operation, a soft-erase operation, a soft-program operation after erase, a soft-erase operation after program, or the like on an invalid block. In an example embodiment, the invalid pattern command CMD_IP may be a command defined according to an interface between the memory controller 310 and the nonvolatile memory device 320 or a vendor specific command. The invalid block address ADDR_IP may be a physical address associated with an invalid block on which an invalid pattern operation will be performed.

The invalid data DATA_IP may be data corresponding to an invalid block to be formed in an invalid block. For example, it is assumed that a lower limit value of an invalid pattern to be formed in an invalid block is a lower limit value of an erase state and an upper limit value is an upper limit value of a first program state. In this case, after an invalid pattern operation is performed, in the case of reading data from memory cells of the invalid block, data corresponding to the erase state and the first program state may be read. In other words, if the memory controller 310 provides the nonvolatile memory device 320 with data corresponding to the erase state or the first program state as the invalid pattern data DATA_IP, the nonvolatile memory device 320 may perform an invalid pattern operation such that the invalid block has an invalid pattern.

The example embodiment described with reference to FIG. 22 is an example. In the case where the invalid pattern command CMD_IP includes information about an invalid block address or information about an invalid pattern, the invalid block address ADDR_IP or the invalid data DATA_IP may be omitted.

Figure 23:
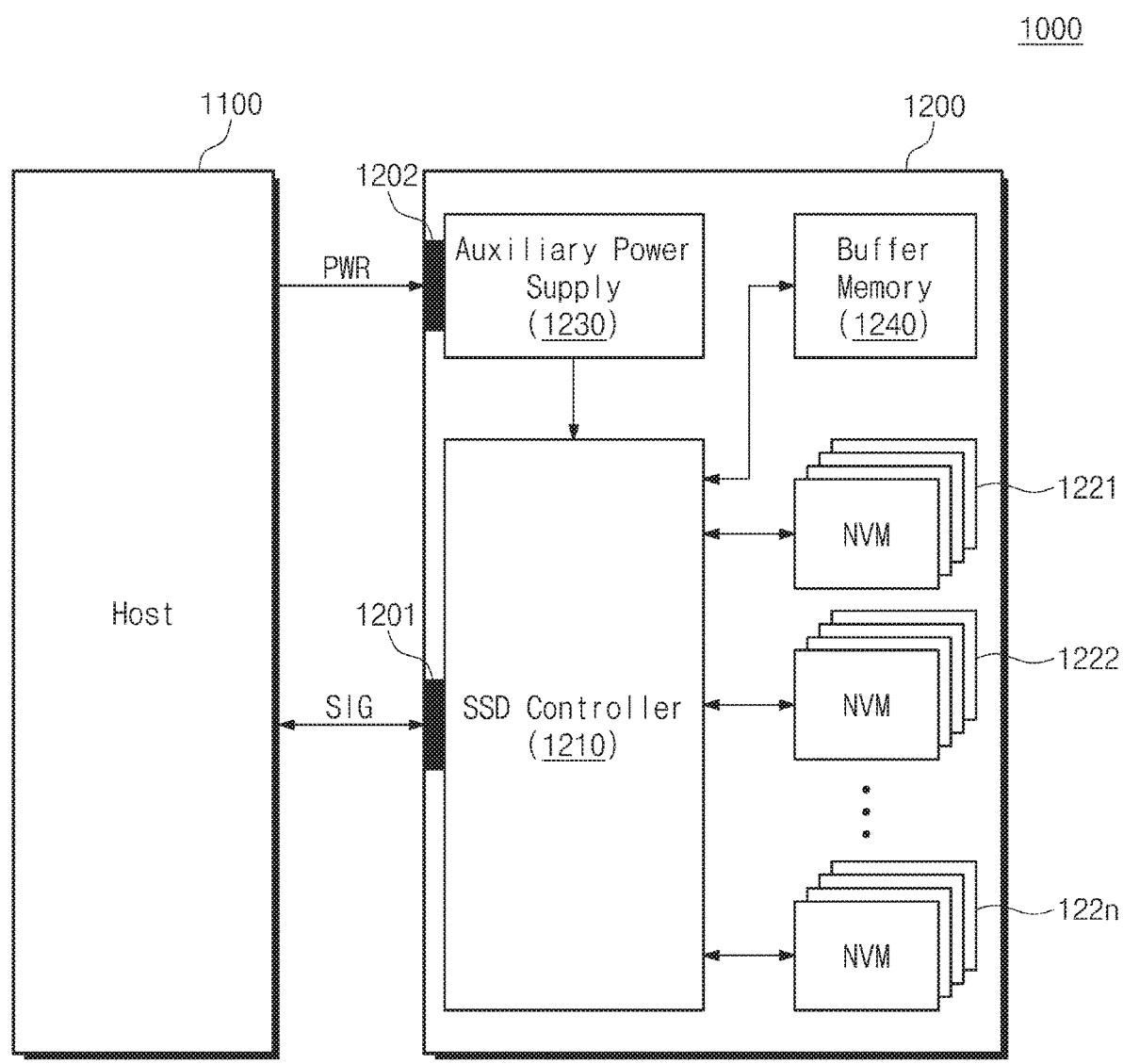
FIG. 23 is a block diagram illustrating a solid state drive (SSD) system to which a storage device according to the inventive concepts is applied.

FIG. 23 is a block diagram illustrating a solid state drive (SSD) system 1000 to which a storage device according to example embodiments of the inventive concepts is applied.

Referring to FIG. 23, the SSD system 1000 includes a host 1100 and an SSD 1200.

The SSD 1200 sends and receives a signal SIG with the host 1100 through a signal connector 1201 and is supplied with power PWR through a power connector 1202. The SSD 1200 includes an SSD controller 1210, a plurality of flash memories 1221 to 122n, an auxiliary power supply 1230, and a buffer memory 1240.

The SSD controller 1210 may control the flash memories 1221 to 122n in response to the signal SIG from the host 1100. In an example embodiment, the SSD controller 1210 may manage invalid blocks occurring in the flash memories 1221 to 122n based on the operation method described with reference to FIGS. 1 to 22.

The flash memories 1221 to 122n may operate under control of the SSD controller 1210. The auxiliary power supply 1230 is connected with the host 1100 through the power connector 1202. The auxiliary power supply 1230 may be charged by the power PWR from the host 1100. When the power PWR is not smoothly supplied from the host 1100, the auxiliary power supply 1230 may power the SSD system 1200.

According to an example embodiment of the inventive concepts, as an invalid block included in a nonvolatile memory device is managed to have a specific pattern (i.e., an invalid pattern), the reliability of data programmed in the invalid block later may be improved. Accordingly, it may be possible to provide an operation method of a memory controller and an operation method of a storage device, capable of improving performance.

While example embodiments of the inventive concepts have been described with reference to some example embodiments thereof, it will be apparent to those of ordinary skill in the art that various changes and modifications may be made thereto without departing from the spirit and scope of the example embodiments of the inventive concepts as set forth in the following claims.

What is claimed is:

1. A method of operating a memory controller, the memory controller configured to control a nonvolatile memory device, the nonvolatile memory device including a plurality of memory blocks, the method comprising:
   detecting an invalid block among the plurality of memory blocks;
   determining an invalid pattern based on a state of the invalid block; and
   performing an invalid pattern operation on the invalid block such that the invalid block has the invalid pattern, the invalid pattern operation including at least one of an erase operation, a soft-erase operation, a program operation, a reprogram operation, and a soft-program operation on the invalid block.

2. The method of claim 1, further comprising:
   determining a number of program/erase cycles of the invalid block, and
   wherein the determining the invalid pattern,
   determines the invalid pattern as a first pattern, in response to the number of program/erase cycles of the invalid block is less than or equal to a first number of times, and
   determines the invalid pattern as a second pattern, in response to the number of program/erase cycles of the invalid block being greater than or equal to a second number of times, the second number of times being greater than the first number of times, and the second pattern being different from the first pattern.

3. The method of claim 2, wherein the invalid pattern operation is performed such that,
   threshold voltages of memory cells included in the invalid block are within a range between a first lower limit value and a first upper limit value, in response to determining the invalid pattern as the first pattern, and
   threshold voltages of the memory cells included in the invalid block are within a range between a second lower limit value and a second upper limit value, in response to determining the invalid pattern as the second pattern, the second lower limit value and the second upper limit value being greater than the first lower limit value and the first upper limit value, respectively.

4. The method of claim 2, wherein the invalid pattern operation is performed such that,
   a middle value of threshold voltages of memory cells included in the invalid block is a first value, in response to determining the invalid pattern as the first pattern, and
   a middle value of threshold voltages of the memory cells included in the invalid block is a second value greater than the first value, in response to determining the invalid pattern as the second pattern.

5. The method of claim 1, wherein the determining of the invalid pattern based on the state of the invalid block comprises:
   performing a cell-counting operation on memory cells of the invalid block based on at least one counting voltage; and
   determining the invalid pattern based on a result of the cell-counting operation.

6. The method of claim 1, wherein the determining of the invalid pattern based on the state of the invalid block comprises:
   detecting an error in data from the invalid block; and
   determining the invalid pattern based on the error.

7. The method of claim 1, wherein the determining of the invalid pattern determines the invalid pattern based on a block characteristic table, the block characteristic table including pattern information corresponding to each of word lines of the invalid block.

8. The method of claim 7, wherein the invalid pattern operation is performed such that,
   memory cells connected with a first word line among the word lines of the invalid block have a first pattern, and
   memory cells connected with a second word line among the word lines of the invalid block have a second pattern, the second pattern being different from the first pattern, the first word line and the second word line being at different heights from a substrate.

9. The method of claim 8, wherein
   threshold voltages of the memory cells connected with the first word line are within a range between a first lower limit value and a first upper limit value,
   threshold voltages of the memory cells connected with the second word line are within a range between a second lower limit value and a second upper limit value, the second lower limit value and the second upper limit value being smaller than the first lower limit value and the first upper limit value, respectively.

10. The method of claim 1, further comprising:
   determining a holding time based on the state of the invalid block; and
   using the invalid block as a free block after the holding time elapses from a time point when the invalid block is detected.

11. The method of claim 1, wherein each of the memory blocks includes a plurality of cell strings, each of the cell strings including a plurality of cell transistors stacked in a direction perpendicular to a substrate.

12. The method of claim 11, wherein each of the plurality of cell transistors includes a charge-trap flash memory cell.

13. A method of operating a storage device, the storage device including a plurality of memory blocks, the method comprising:
   detecting an invalid block among the plurality of memory blocks;
   determining an invalid pattern based on a state of the invalid block; and
   performing an invalid pattern operation on the invalid block such that the invalid block has the invalid pattern, the invalid pattern operation being at least one of an erase operation, a soft-erase operation, a program operation, a reprogram operation, and a soft-program operation on the invalid block.

14. The method of claim 13, wherein the invalid block is generated by a garbage collection operation or a read reclaim operation.

15. The method of claim 13, wherein the invalid pattern operation is performed such that a middle value of threshold voltages of memory cells of the invalid block having the invalid pattern increases as a number of program/erase cycles of the invalid block increases.

16. The method of claim 13, wherein the invalid pattern operation is performed such that memory cells included in the invalid block having the invalid pattern have a threshold voltage distribution that varies with a height of a word line.

17. The method of claim 13, further comprising:
   determining a holding time based on the state of the invalid block; and
   after the holding time elapses in a state where the invalid block has the invalid pattern,
      erasing the invalid block, and
      programming valid data in the invalid block that is erased.

18. A method of operating a memory controller, the memory controller configured to control a nonvolatile memory device that includes a plurality of memory blocks, the method comprising:
   detecting an invalid block among the plurality of memory blocks;
   determining an invalid pattern based on a state of the invalid block; and
   sending an invalid pattern command to the nonvolatile memory device, the invalid pattern command including an address for the invalid block, the invalid pattern command corresponding to at least one of an erase operation, a soft-erase operation, a program operation, a reprogram operation, and a soft-program operation on the invalid block.

* * * * *